United States Patent
Deleonibus (12)

(10) Patent No.: US 7,022,562 B2
(45) Date of Patent: Apr. 4, 2006

(54) FIELD-EFFECT TRANSISTOR WITH HORIZONTAL SELF-ALIGNED GATES AND THE PRODUCTION METHOD THEREFOR

(75) Inventor: Simon Deleonibus, Claix (FR)

(73) Assignee: Commissariat a L'Energie Atomique, Paris (FR)

( * ) Notice: Subject to any disclaimer, the term of this patent is extended or adjusted under 35 U.S.C. 154(b) by 0 days.

(21) Appl. No.: 10/486,369

(22) PCT Filed: Aug. 30, 2002

(86) PCT No.: PCT/FR02/02972

§ 371 (c)(1),
(2), (4) Date: Mar. 2, 2004

(87) PCT Pub. No.: WO03/021633

PCT Pub. Date: Mar. 13, 2003

(65) Prior Publication Data

US 2004/0197977 A1      Oct. 7, 2004

(30) Foreign Application Priority Data

Sep. 3, 2001      (FR)      ................................. 01 11366

(51) Int. Cl.
*H01L 21/336*      (2006.01)
*H01L 21/8234*    (2006.01)

(52) U.S. Cl. ..................... 438/197; 257/346; 257/213; 438/180

(58) Field of Classification Search ................ 257/346, 257/192, 197, 212, 213, 217, 218, 183, 347, 257/368, 369; 438/197, 180, 181, 167, 169, 438/172, 229, 311
See application file for complete search history.

(56) References Cited

U.S. PATENT DOCUMENTS

| | | | |
|---|---|---|---|
| 5,349,228 A | | 9/1994 | Neudeck et al. |
| 5,397,909 A | * | 3/1995 | Moslehi ...................... 257/383 |
| 5,583,362 A | | 12/1996 | Maegawa |
| 5,773,331 A | * | 6/1998 | Solomon et al. ............. 438/164 |
| 6,166,412 A | | 12/2000 | Kim et al. |
| 6,380,039 B1 | * | 4/2002 | Badenes et al. ............. 438/301 |
| 6,492,210 B1 | * | 12/2002 | Wieczorek et al. .......... 438/149 |

* cited by examiner

*Primary Examiner*—David Nhu
(74) *Attorney, Agent, or Firm*—Oblon, Spivak, McClelland, Maier & Neustadt, P.C.

(57) ABSTRACT

A field-effect transistor including: a support substrate, an active area forming a channel; a first active gate which is associated with a first face of the active area; source and drain areas which are formed in the active area and which are self-aligned on the first gate; a second insulated gate which is associated with a second face of the active region opposite the first face of the active region. According to the invention, the second gate is self-aligned on the first gate and, together with the first gate, forms a mesa structure on a support substrate.

21 Claims, 19 Drawing Sheets

FIELD-EFFECT TRANSISTOR WITH HORIZONTAL SELF-ALIGNED GATES AND THE PRODUCTION METHOD THEREFOR

TECHNICAL DOMAIN

The present invention relates to a field-effect transistor, with horizontal self-aligned gates.

It also relates to a process for manufacturing such a transistor.

Transistor with horizontal gates is understood to mean a transistor whose gates extend substantially according to a plane parallel to a main face of a substrate on which the transistor is made. The invention relates in particular to a double-gate transistor, that is, a transistor comprising two gates placed on two opposite faces of a channel region.

Transistors of the type mentioned hereinabove are used mainly in the manufacture of numerical circuits, for making logic commutators or analogue circuits, for example for radiofrequency devices. Applications can be also found in other domains of electronics.

PRIOR ART

Documents (1) to (4), whereof the references are specified at the end of the description concern transistors with double insulated gate. In particular they are transistors fabricated on substrates of silicon on insulator type, SOI (Silicon On Insulator).

To manufacture double-gate transistors a substrate is used, wherein a first gate has previously been formed, and comprising a channel layer above the first gate. The second gate is formed on the substrate by depositing a layer of gate material and by etching this layer to form it. The second gate can be used as doping mask for self-aligned doping of the source and drain regions.

One of the main difficulties occurring in the manufacture of double-gate transistors is associated with alignment of the gates on one another, and with their alignment on the channel region. The alignment of the gates is all the more delicate since miniaturisation of the transistors is considerable. The quality of the alignment is associated essentially with the precision of placing an etching mask for formatting the second gate.

The effect of an alignment fault, even if it does not compromise the operation of the transistor, is to render the transistor dissymmetric. This dissymmetry leads to augmentation of gate/source, or gate/drain parasite capacities, known as Miller capacities. Augmentation of the Miller capacities leads to alteration of the dynamic behaviour of the transistors and thus to a reduction in their commutation speed or their cut-off frequency.

Another harmful effect of the dissymmetry of the transistors, particularly sensitive in numerical applications, is the approximate definition of the high and low (0 and 1) logic levels.

DESCRIPTION OF THE INVENTION

The aim of the present invention is to propose a double-gate transistor, which does not have the limitations specified hereinabove.

A goal in particular is to propose such a transistor, which is perfectly symmetrical for regular definition of high and low logic levels.

Another aim still is to propose a transistor having reduced parasite capacities and improved dynamic behaviour.

The final aim of the invention is to propose different processes for producing such a transistor.

To achieve the aims specified hereinabove, the object of the invention more precisely is a field-effect transistor comprising on a substrate:
- an active region forming a channel,
- a first insulated gate associated with a first face of the active region,
- source and drain regions formed in a part of the active region, on either side of the channel, and self-aligned on the first gate,
- a second insulated gate associated with a second face of the active region, opposite the first face of the active region.

According to the present invention the second gate, which is the closest to the support substrate, is auto aligned on the first gate and with the first gate forms a mesa structure on the support substrate of the transistor.

In terms of the present invention, two parts of a component are self-aligned when one of the parts is used as a tool in the manufacture of the other part, such that the part manufactured second is aligned automatically, or at least centred on the first.

The auto-alignment is not reliant on the precision of any external alignment tool.

The auto-alignment consists essentially of using part of a component as a mask for an etching, oxidation, or doping operation of another part. It enables perfect alignment of the parts in question. The other part is then self-aligned on the part of the component serving as mask.

Due to the self-aligned nature of the gates, the transistor proves to be perfectly symmetrical and responds to the objectives of the invention.

The two gates, and possibly a channel part, have the structure of a symmetrical mesa. In other words, they form a symmetrical elevation on the substrate, characteristic of self-aligned treatment.

The invention also relates to a process for manufacturing such a transistor, and more generally a transistor with self-aligned gates. The process comprises the following stages:
- formation of a stack of layers comprising, from a support substrate: a first gate layer, an insulating gate layer, an active layer, a second insulating gate layer, and a second gate layer,
- definition of a gate, said upper gate, in the second gate layer,
- formation in the active layer of source and drain regions self-aligned on the upper gate, and
- formation of a gate, said lower gate, positioned between the support substrate and the active layer, the lower gate being formed in a self-aligned manner on the upper gate.

It is considered that the formation of the lower gate is self-aligned on the upper gate when it is self-aligned on this bare gate or on this gate fitted with other self-aligned elements such as lateral spacers.

Even though the process makes explicit reference to a transistor, it can be implemented for concomitant manufacture of a plurality of transistors. Furthermore, the layers of material mentioned hereinabove can be simple layers or constituted by one or more sub-layers.

The lower gate can be made in the first gate layer. It can also, as to be explained hereinbelow, be formed in another layer replacing the first gate layer.

At the time it is being formed, the lower gate can be delimited in the first gate layer by selective etching self-aligned on the upper gate. The self-aligned nature can be obtained directly by using the upper gate as an etching mask. According to another possibility, the upper gate can also be used as an implantation mask for doping, by implantation, the first gate layer. In this case, the doped part of the first gate layer is selectively etched to form the lower gate.

According to yet another possibility, the lower gate can be delimited by self-aligned oxidation of the first gate layer. The effect of oxidation is to make the gate material locally insulating, and thus limit the lateral extension of the gate.

The upper gate serves in this case as oxidation mask for protecting the part of the first gate layer, which it covers from oxidation.

As explained hereinabove, the formation of the lower gate can comprise replacement of the first gate layer by one or more new gate layers, then self-aligned delimitation of the new gate layer.

The new gate layer can be delimited self-aligned doping and selective etching. It can again be delimited direct self-aligned etching or by oxidation.

When it is delimited by oxidation, the oxidised part can be likewise etched and eliminated.

According to a particular aspect of implementing the process, first and second gates extending into a region extending beyond the active region can be created. In this case, a metallised well passing through the stack of layers to electrically link the upper gate to the lower gate is made advantageously in the region extending beyond the active region.

The interconnection of the gates allows the same potential for controlling the transistor to be applied to them, thus avoiding multiplying the gate access terminals.

In the process hereinabove the upper gate can be benefited from not only to delimit the lower gate, but also to delimit the channel in the active layer. For example, the process may further comprise self-aligned etching of the active layer, by using the upper gate as an etching mask.

Prior to this etching lateral spacers can be formed on the upper gate.

To delimit the lower gate, the upper gate and optionally the active layer previously etched can be utilised. Seconds spacers can be provided to this effect on the flanks of the structure formed by the first gate and the etched active layer. The utilisation of spacers produces a lower gate extending beyond the upper gate while remaining perfectly aligned, or more precisely, centred, on the latter.

Other characteristics and advantages of the invention will emerge from the following description, in reference to the figures of the attached diagrams.

This description is made purely illustratively and non-limiting.

DETAILED DESCRIPTION OF EMBODIMENTS OF THE INVENTION

Figure 1:
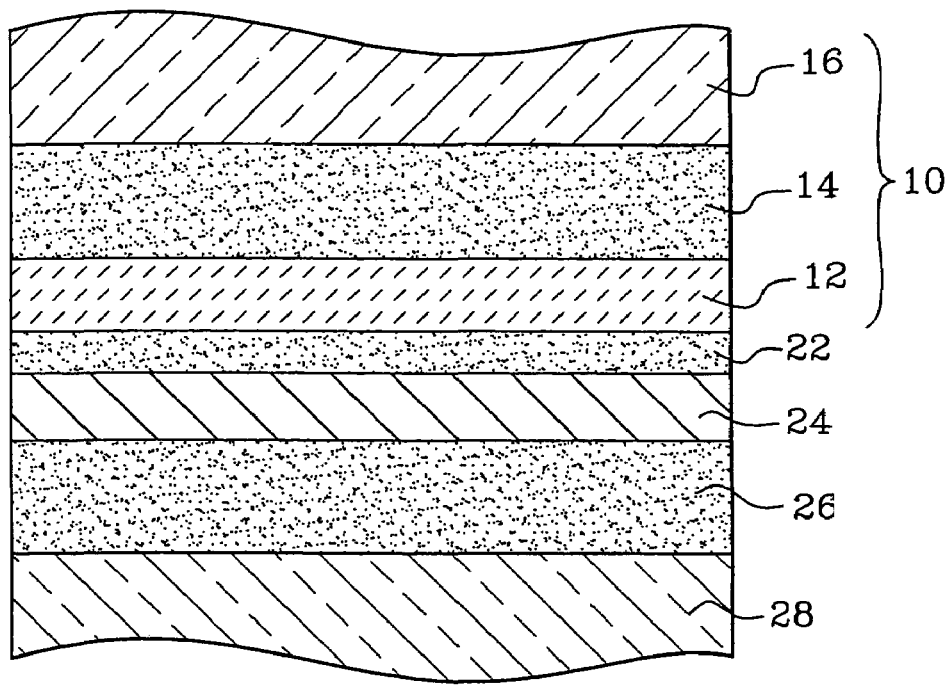
FIGS. 1 and 2A are diagrammatic sections of stacks of layers illustrating the manufacture of a substrate for formation of a transistor according to the present invention.

In the following description identical, similar or equivalent parts of the different figures are designated by the same reference numerals to facilitate the relationship between the figures. In addition, and for the sake of clarity of the figures, all the elements are not represented according to a uniform scale.

FIG. 1 shows a preparation stage of a substrate for the manufacture of one or more transistors according to the present invention.

Reference 10 in FIG. 1 designates a substrate of SOI type with a thin superficial layer of optionally doped monocrystalline silicon 12, an embedded layer of silicon oxide 14 and a layer of solid silicon 16. Formed successively on the substrate are a first insulating gate layer 22, a first gate layer 24, and an insulating base layer 26.

The insulating gate layer 22 is for example an oxide layer of silicon. The first gate layer 24 can be a conducting layer of a material metallic or, in the example described, a semi-conductor material such as polycrystalline silicon. The insulating base layer 26 is preferably made of silicon oxide or metal oxide.

It can be deposited or formed by oxidation of a part of the gate layer 24.

The insulating base layer 26 is then stuck on a block of solid silicon 28 to form the stack of FIG. 1. This is direct molecular adhesion, for example.

Figure 2A:
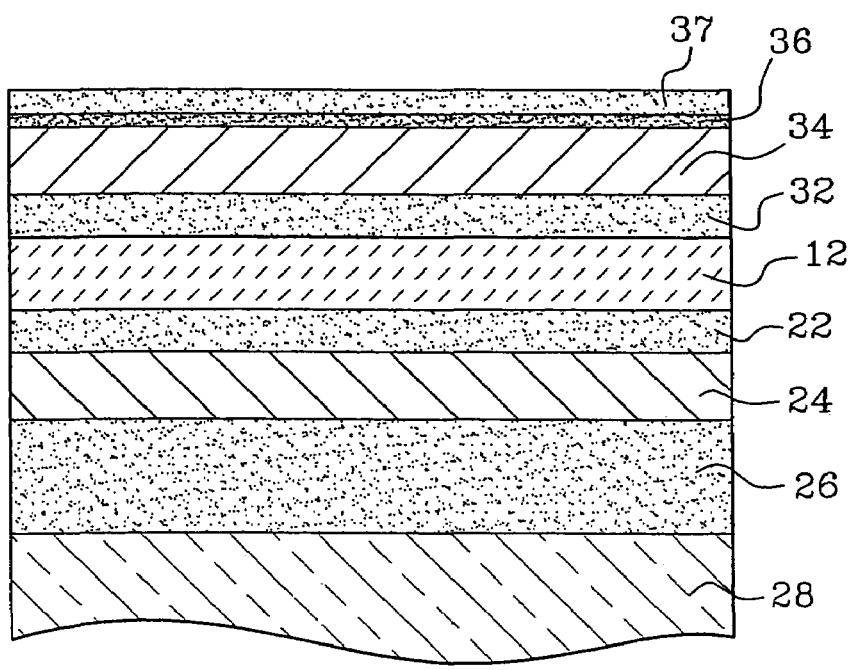

FIG. 2A shows the elimination of the embedded layer of oxide 14 and of the layer of solid silicon 16 of the SOI substrate 10, leaving only the layer mince 12. This is again designated as "active layer" hereinbelow. The active layer of silicon 12 is then covered by successive deposits of a second insulating gate layer 32, a second gate layer 34, and a covering gate layer 36 and a buffer layer 37 of surface etching.

Just as for the first gate layer 24, the second gate layer can be metallic, for example W, Ti, TiN, Hf, Zr, etc., or semiconductive, for example, polycrystalline silicon, or in a combination of several layers of these materials. Optionally, other materials can be used for prior formation of a dummy upper gate, which is ultimately replaced by a definitive gate.

The covering layer of gate 36 is an insulating layer, for example, of silicon nitride.

The buffer layer 37 is, for example, silicon oxide ($SiO_2$). Its role is described hereinbelow.

It should be specified that prior to formation of the second insulating gate layer 32 and of the second gate layer 34, the active layer 12 can be etched according to a pattern defined by an etching mask, not shown here, to delimit it as previously. This aspect will again be referred to following the description.

Figure 2B:
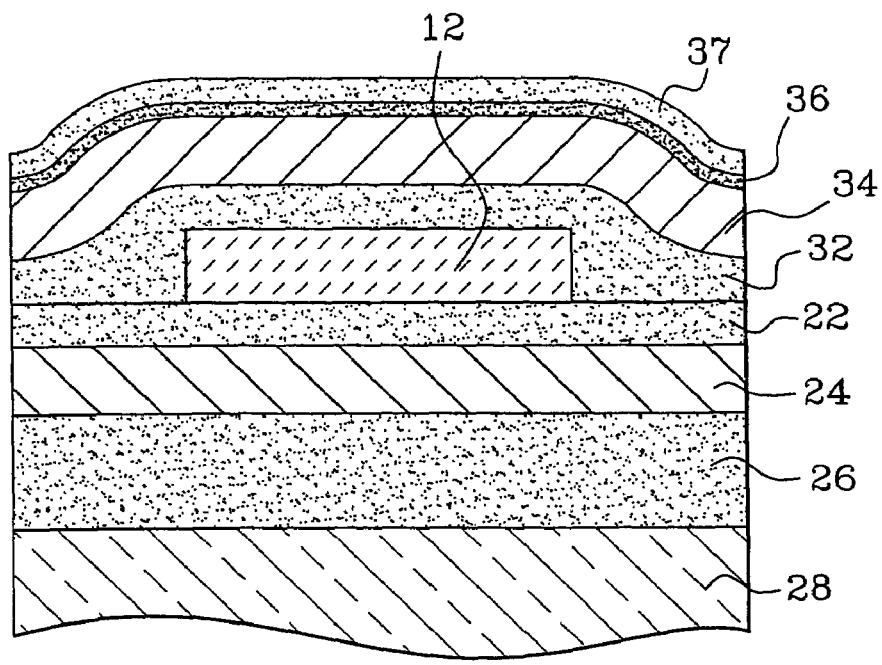
FIG. 2B is a section of the stack of FIG. 2A according to a cutting plane perpendicular to the cutting plane of FIG. 2A.

FIG. 2B, which is a section of the stack of layers according to a cutting plane perpendicular to the plane of FIG. 2A, shows the lateral extension of an active region defined in the active layer 12 delimited as indicated hereinabove. Beyond this region, the second insulating gate layer 32 is no longer separated from the first insulating gate layer 22 and rests directly thereon. The active region is likewise designated by reference numeral 12 for reasons of convenience.

Figure 3A:
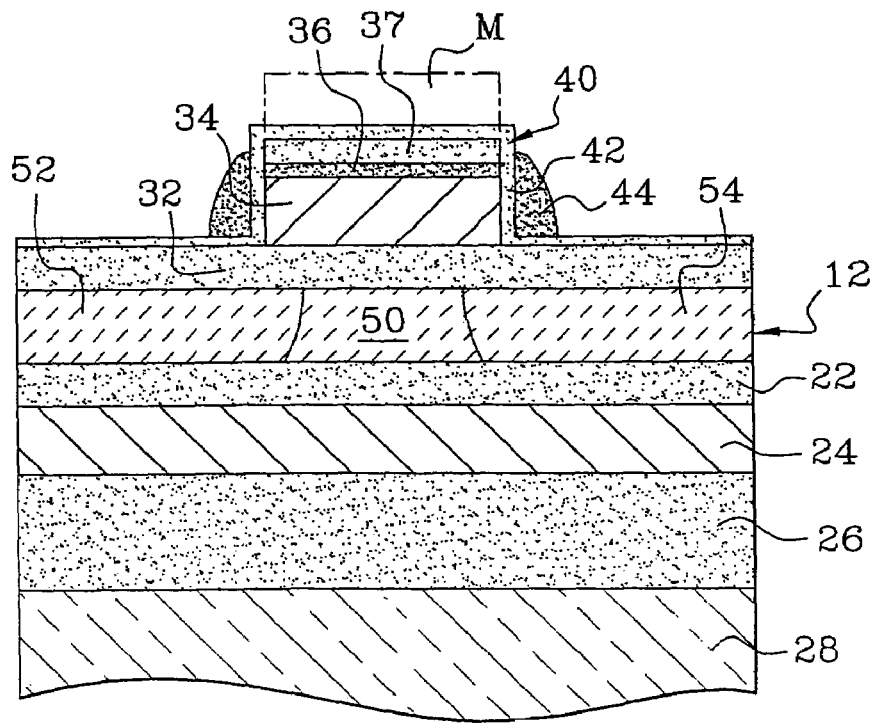
FIGS. 3A and 3B are diagrammatic sections of the substrate of FIG. 2A illustrating the forming of an upper gate of the transistor.

FIG. 3A shows a first operation aimed at forming the upper gate. The gate layer 34 and the covering gate layer 36 are subjected to selective anisotropic etching, with stop on the second insulating gate layer 32. An etching mask M shown in dashed lines protects, during this etching, that part of the layers for forming the upper gate 40. The mask M is removed after etching of the layers.

After the first etching, a first pedestal layer 42 is formed on the gate 40. This is, for example, a layer of silicon oxide. The first pedestal layer 42 is fitted with first lateral spacers 44 of silicon nitride. They are formed by depositing of a layer of silicon nitride, then by anisotropic etching of this layer to extract from it the parts covering surfaces parallel to the plane of the layers. During this anisotropic etching, the buffer layer 37 protects the covering layer.

Figure 3B:
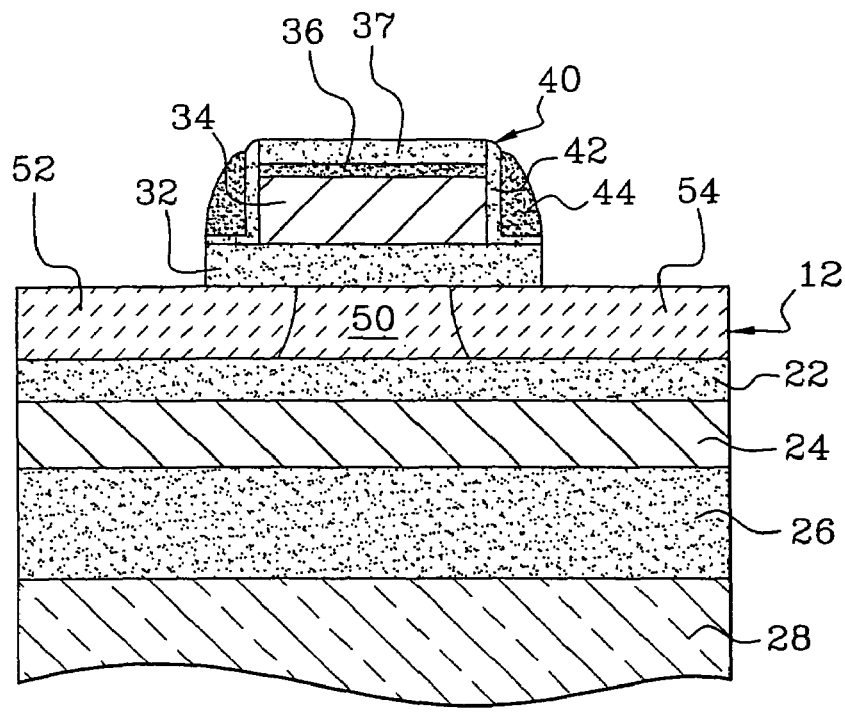

The gate 40, flanked by the pedestal layer 42 and first spacers 44, is used as etching mask during subsequent etching of the second insulating gate layer 32. This is, as shown in FIG. 3B, self-aligned and selective etching of the insulating gate layer with stop on the active layer 12. During this etching, the part of the pedestal layer 42 covering the buffer layer 37 is removed. The buffer layer can likewise be cut during this etching.

Before or after this etching, doping of the active layer is carried out by means of doping impurities of the type opposite that of the layer 12 to form regions of source 52 and of drain 54. The doping is done, for example, by implantation of ions of doping impurities, self-aligned on the gate 40. During this operation the gate 40 can be flanked or not by spacers 42.

Thermal activation treatment of the doping impurities causes slight diffusion under the gate 40. The part of the active layer 12 situated under the middle of the gate 40, that is, the part of the doping preserved during formation of the source and drain, constitutes a channel region 50. When the active layer 12 is previously doped, it is doped with impurities of the type opposite that of the impurities used for doping the source and drain.

Figure 4:
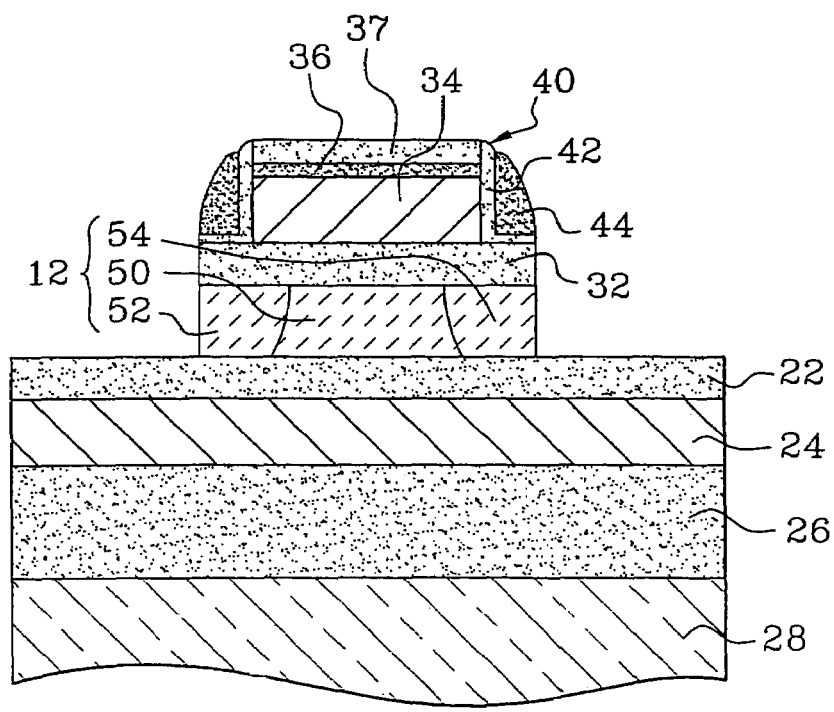
FIG. 4 is a diagrammatic section of the device of FIG. 3 illustrating the forming of an active layer of the transistor.

After formation of the source and drain regions, the active layer 12 is likewise etched selectively with stop on the first insulating gate layer 22. As shown in FIG. 4, this is self-aligned etching which utilises the gate 40, flanked by the first pedestal 42 and by the spacer 44, as etching mask.

Figure 5:
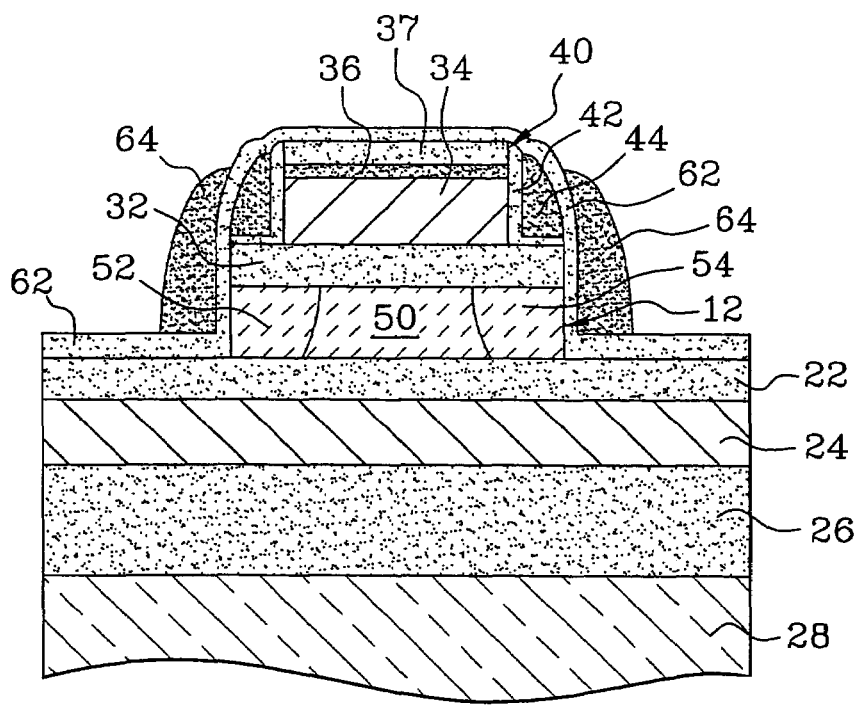
FIG. 5 is a diagrammatic section of the device of FIG. 4 illustrating a preparatory stage of the forming of a lower gate of the transistor.

FIG. 5 shows the formation of a second pedestal layer 62 and a second spacer 64 on the flank of the ensemble comprising the upper gate 40 already equipped with a spacer, the second insulating gate layer 32, and the active layer 12, such as delimited by the etching.

In the example described, the second pedestal layer 62 and the second spacer 64 are respectively made of silicon oxide and silicon nitride.

Figure 6:
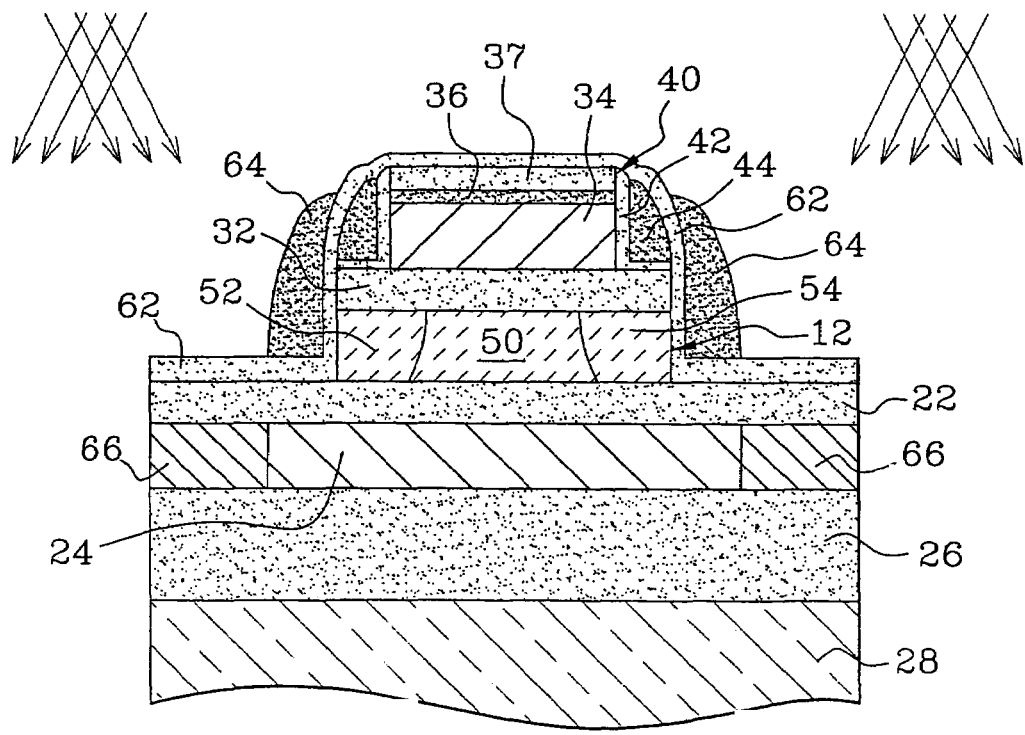
FIGS. 6 to 8 are diagrammatic sections of the device of FIG. 5 illustrating the forming of the lower gate of the transistor.

A subsequent stage, illustrated by FIG. 6, comprises implantation of doping impurities in the first gate layer 24. These are, for example, impurities of germanium, boron or carbon.

The implantation energy is selected as sufficient for passing through the second pedestal layer 62, if the latter is not removed previously, and for passing through the first insulating gate layer 22.

This implantation is implantation self-aligned on the gate. It actually uses, as implantation mask, the gate, flanked by the first and second spacers, as well as the pedestal layers.

The doped regions of the first gate layer on either side of the gate are indicated by reference numeral 66.

Figure 7:
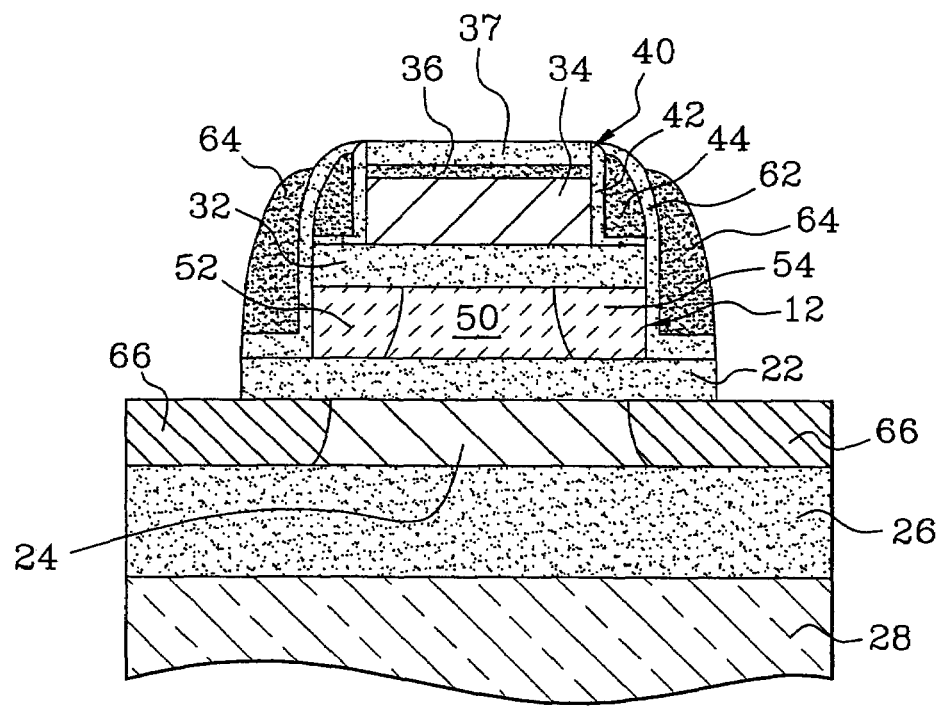

Thermal activation treatment enables the implanted doping types to be diffused slightly and, as shown in FIG. 7, enables the lateral extension of the doped regions 66 under the implantation mask to be adjusted.

FIG. 7 likewise shows selective etching of the second pedestal layer 62 and the first insulating gate layer 22. This etching is again self-aligned. It utilises the gate, flanked by spacers 44, 64, as etching mask and uncovers parts of the doped regions 66, not protected by the etching mask.

The effect of etching is to eliminate the part of the second pedestal layer 62 covering the buffer layer 37, and optionally to start cutting the buffer layer. The buffer layer is provided sufficiently thick so as not to be wholly removed.

Figure 8:
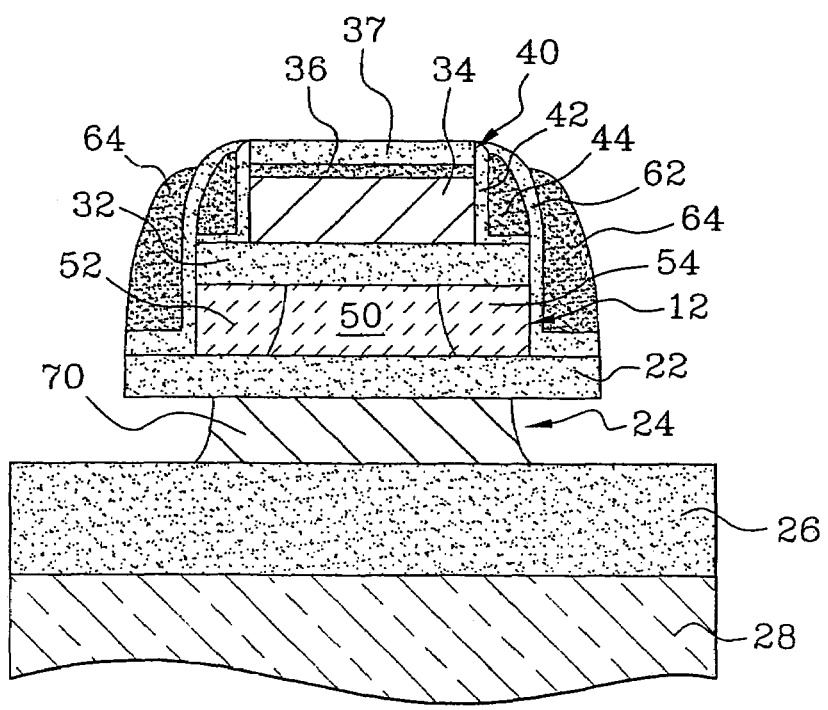

FIG. 8 shows selective etching of the doped regions, preserving only a part 70 of the gate layer 24, which constitutes the lower gate.

The etching is selective relative to the insulation of gate 22, relative to the insulating base layer 26, relative to the spacers, and, of course, relative to the material of the non-doped gate layer.

As all the preceding operations are self-aligned, and in particular the doping and etching operations of the insulating gate layer, the lower gate is likewise self-aligned, and thus centred, on the upper gate 40.

Figure 9:
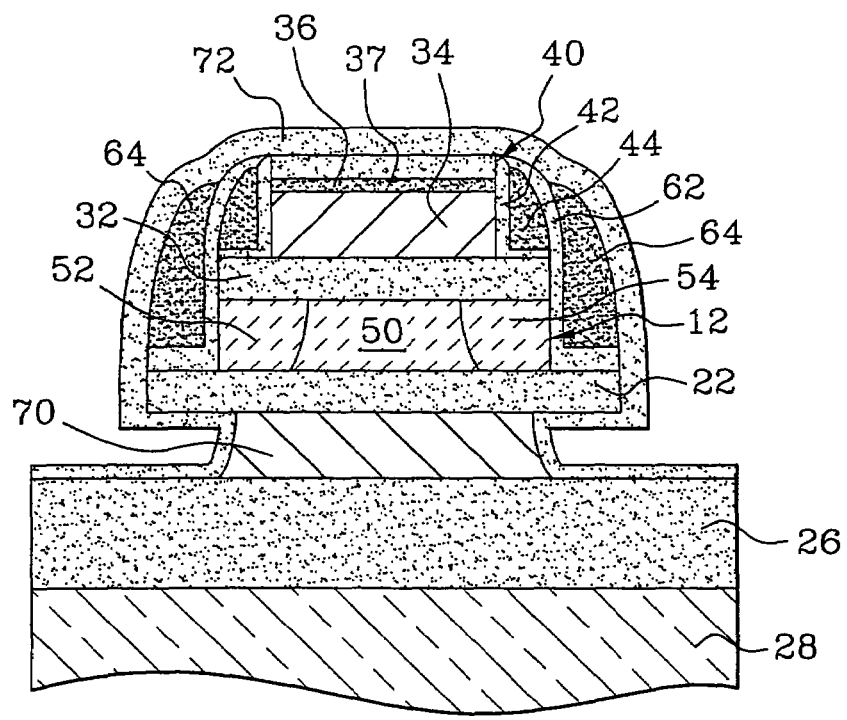
FIGS. 9 to 11 are diagrammatic sections of the device of FIG. 8 illustrating insulation of the lower gate of the transistor.

FIG. 9 shows the formation of a third pedestal layer 72. This is a deposited layer of silicon oxide. The third pedestal layer 72 carpets the insulating base layer 26, the flanks of the lower gate 70, the first insulating gate layer 22, the second spacer 64, and the buffer layer 37 remaining at the top of the upper gate 40.

Figure 10:
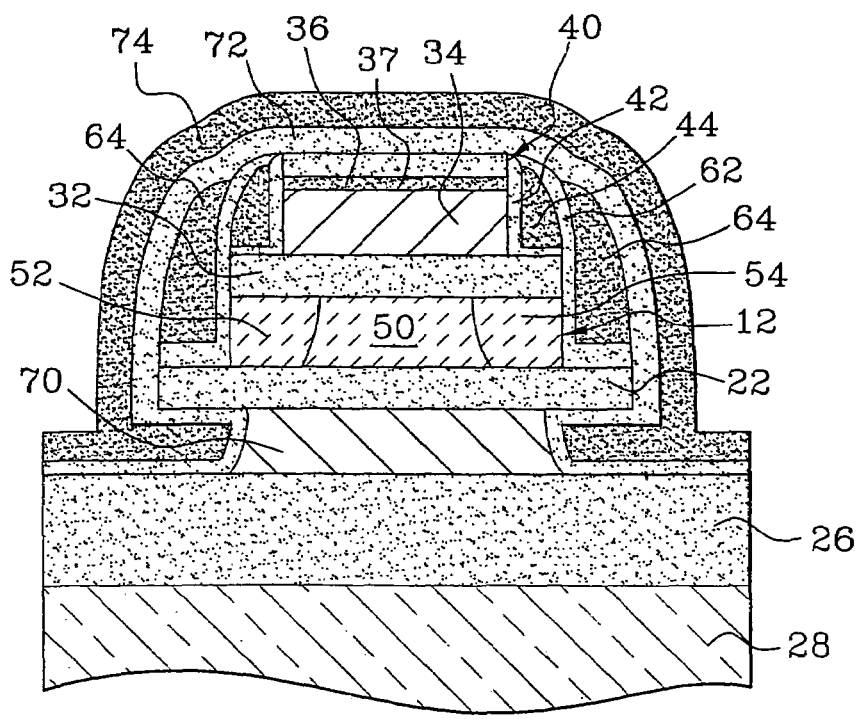

The formation of the third pedestal layer is followed by depositing of a layer of silicon nitride 74, intended to form a third spacer. FIG. 10 shows that the layer of silicon nitride fully covers the third pedestal layer and completely fills a cavity situated under the second insulating gate layer 22 and bordering the lower gate 70. This cavity is that freed during etching of the doped regions, which have aided in adjusting the lateral extension of the lower gate. In the plane of FIG. 10, it extends on either side of the lower gate.

Figure 11:
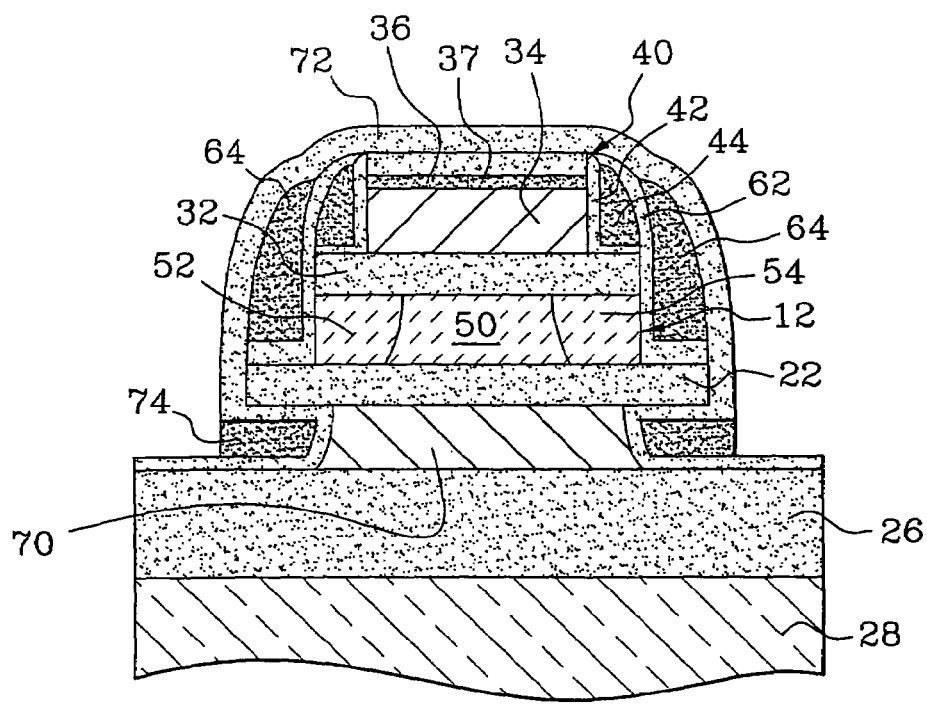

FIG. 11 shows the result of selective anisotropic etching of the superficial layer of silicon nitride 74 with stop on the subjacent third pedestal layer 72. As the etching is anisotropic, the part of the layer of silicon nitride present in the cavity bordering the lower gate, is preserved. It constitutes a third buried spacer, which is likewise designated by the reference 74 for convenience.

A certain number of operations for making contacts on different parts of the transistor and especially on the source and drain regions will now be discussed.

Figure 12:
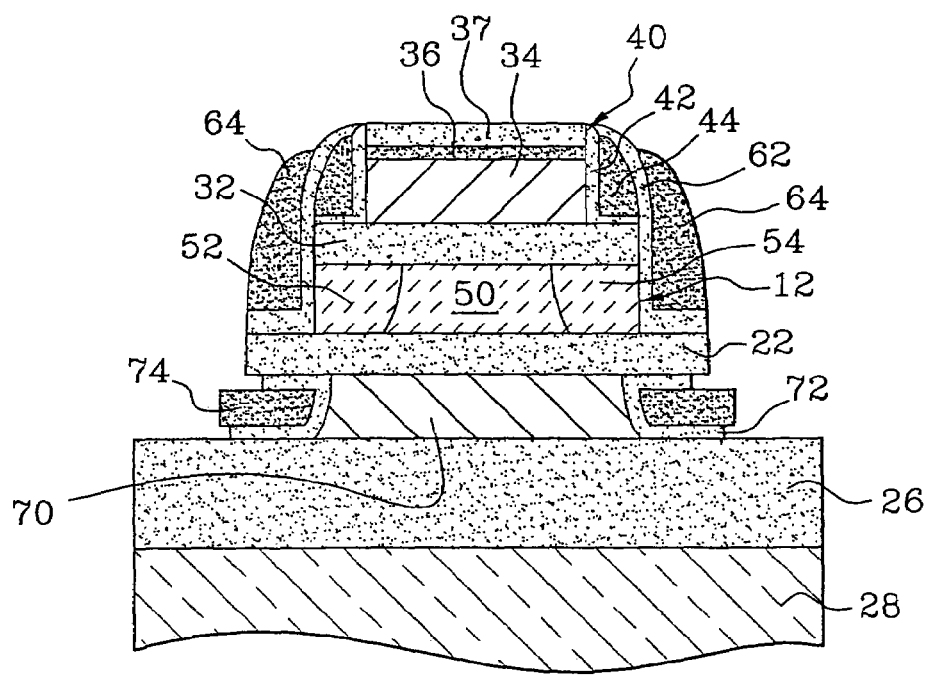
FIGS. 12 and 13 are diagrammatic sections of the device of FIG. 11 and illustrate stages of preparation for the formation of lateral extensions of source and drain.

A certain number of selective etchings successively removes the insulating layers, which laterally cover the source and drain regions 52, 54. A first stage, illustrated by FIG. 12, shows the contraction of the third pedestal layer. The contraction of this layer takes place by selective etching of the silicon oxide of the third pedestal layer relative to the silicon nitride of the second and third spacers 64, 74. Above the gate, the silicon oxide of the buffer layer 37 is not fully removed: it protects the covering layer 36. The covering layer 36 can also be preserved in the absence of the buffer layer 37 by imparting an initial thickness sufficient to not fully disappear during contraction of the spacers.

In FIG. 12, a heel of the third pedestal layer 72 protected in part by the buried spacer 74 is also observed.

Figure 13:
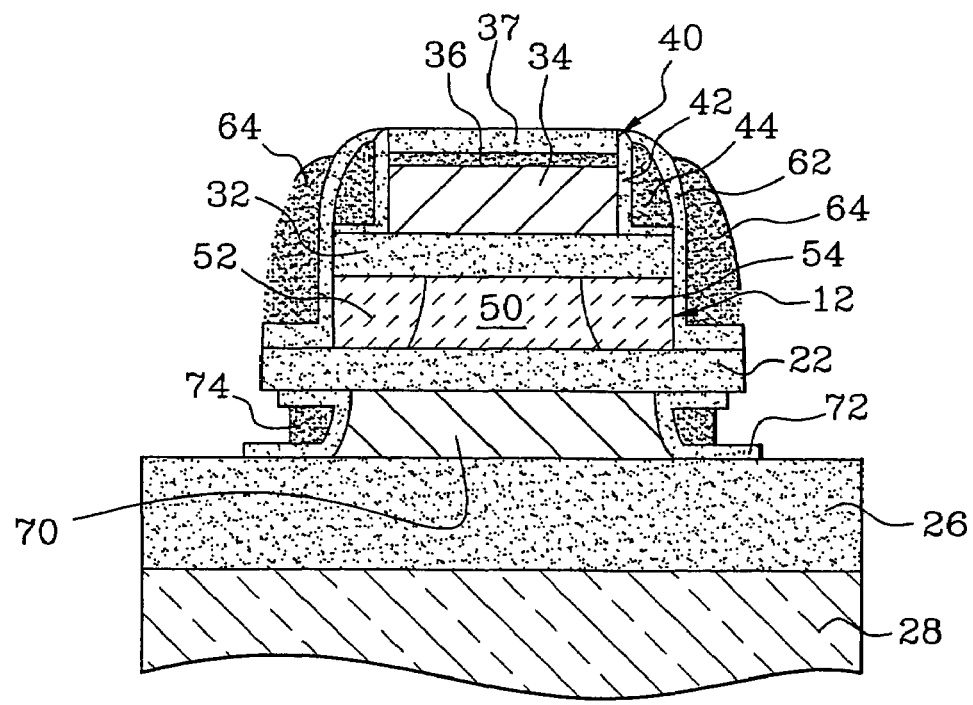

A second selective etching, illustrated by FIG. 13, for removing the silicon nitride from the second and third spacers is now discussed. This etching is selective and is done with stop on the silicon oxide of the second pedestal layer 62 since revealed. It can be seen that, in the example illustrated, the third buried spacer 74 is not fully removed owing to its thickness.

A third etching is for selectively removing the silicon oxide from the second pedestal layer 62. This etching lays bare the flanks of the source and drain regions 52, 54, of the second insulating gate layer 22 and the first spacer 44.

Figure 14:
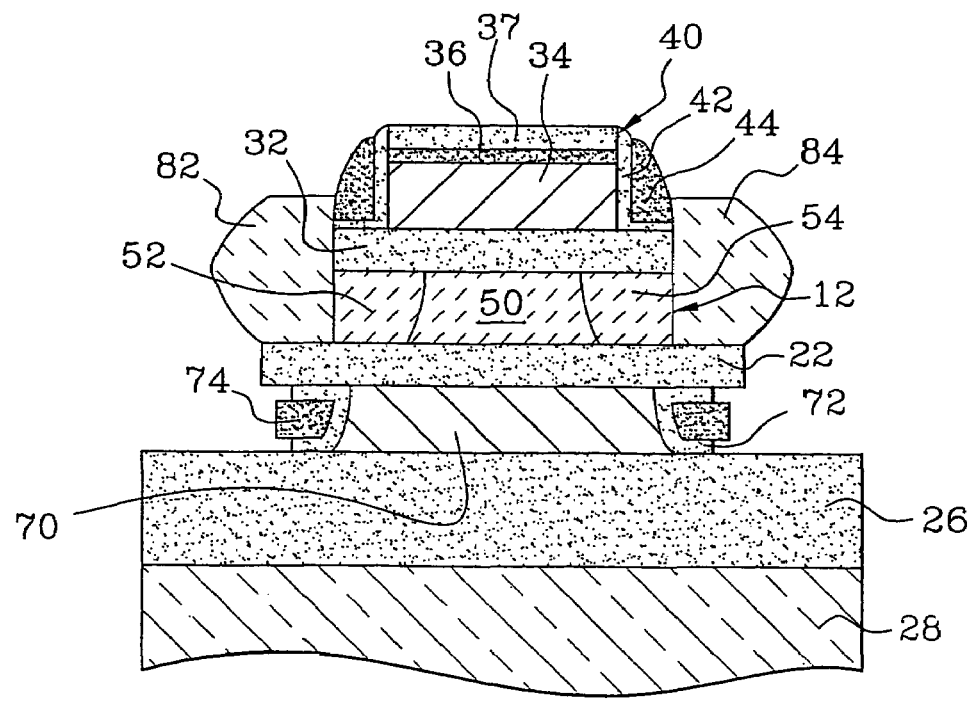
FIG. 14 is a diagrammatic section of the device of FIG. 13 illustrating the formation of lateral extensions of source and drain.

The third etching is followed by selective epitaxy of silicon on the layer of monocrystalline silicon 12, and more precisely the flanks of the source and drain regions 52, 54. FIG. 14 illustrates the epitaxy. The growth selectivity is guaranteed by the first and second layers of gate insulation, and by the buried spacer 74, or at the very least the part of the third pedestal layer 72 protected by the buried spacer. The growth selectivity is again guaranteed by the first spacer 44 and by the first pedestal layer or the layer of silicon nitride 36 at the apex of the gate. Epitaxy helps regions of lateral extension of source and drain, 82, 84 form. These regions present facets imposed initially by the edges of the monocrystalline layer of the source and drain. The facets are conserved throughout the growth process.

Figure 15:
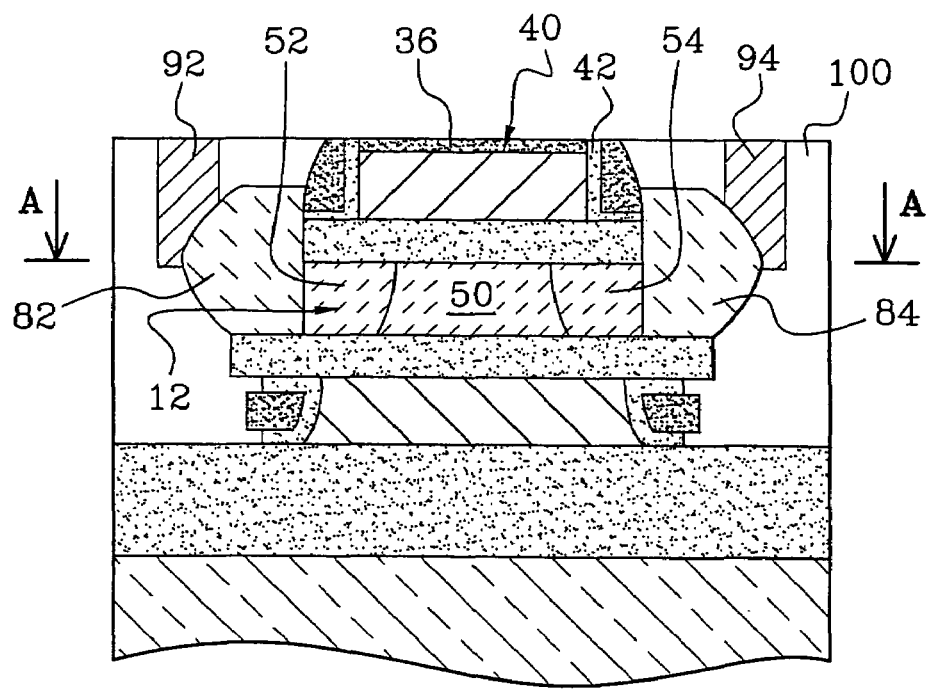
FIG. 15 is a diagrammatic section of the device of FIG. 14 illustrating the processing of the transistor and the formation of contacts of source and drain.

FIG. 15 illustrates packaging of the transistor of FIG. 14. The mesa structure of FIG. 14 is covered by a thick layer 100 of insulating material, such as silica. The layer 100 undergoes planing, for example by mechanical-chemical polishing, with stop on the first pedestal layer at the apex of the gate, or on the covering layer of gate 36 of silicon nitride. Wells are etched in the insulating layer 100 vertically to the lateral extensions of source and drain 82, 84. Inasmuch as the lateral extensions are sufficiently wide, alignment of the etching of the wells is facilitated. The wells are filled with an electric conductor material, for example a metal, which makes contact on the lateral extensions of source and drain at the bottom of each well.

After it is formed the metal constitutes contacts 92, 94 for the interconnection of the transistor with other components. Arranging contacts on the gates is described hereinbelow.

It can be added that, if the above-mentioned gate materials were not definitive materials, and if the gate 40 is a dummy gate, then its replacement can likewise take place after deposit and planing of the insulating layer.

Figure 16:
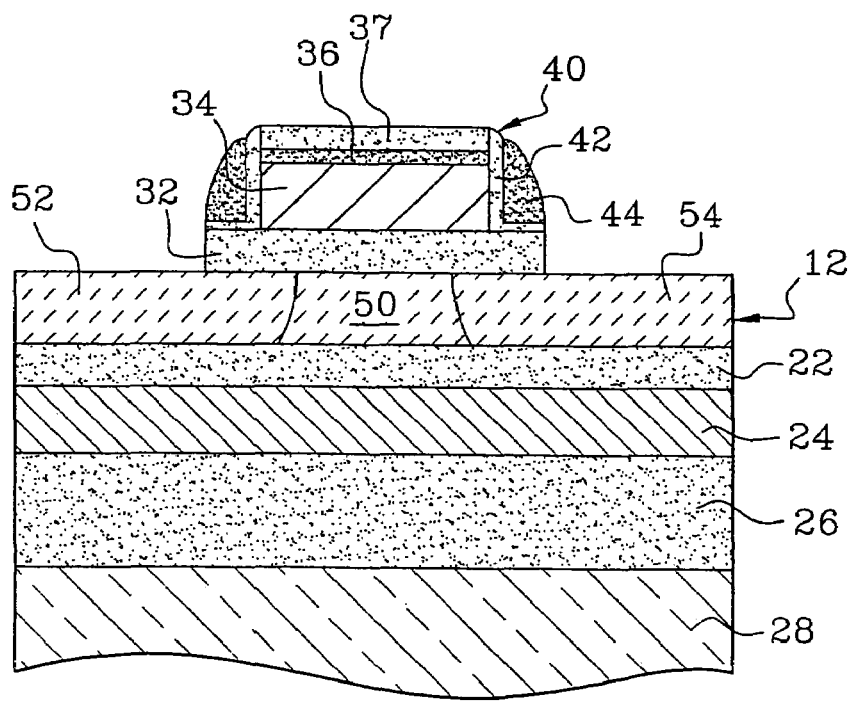
FIGS. 16 and 17 are diagrammatic sections of the device of FIG. 3 and illustrate stages of manufacture of a transistor according to a variant of the process previously described.
Figure 17:
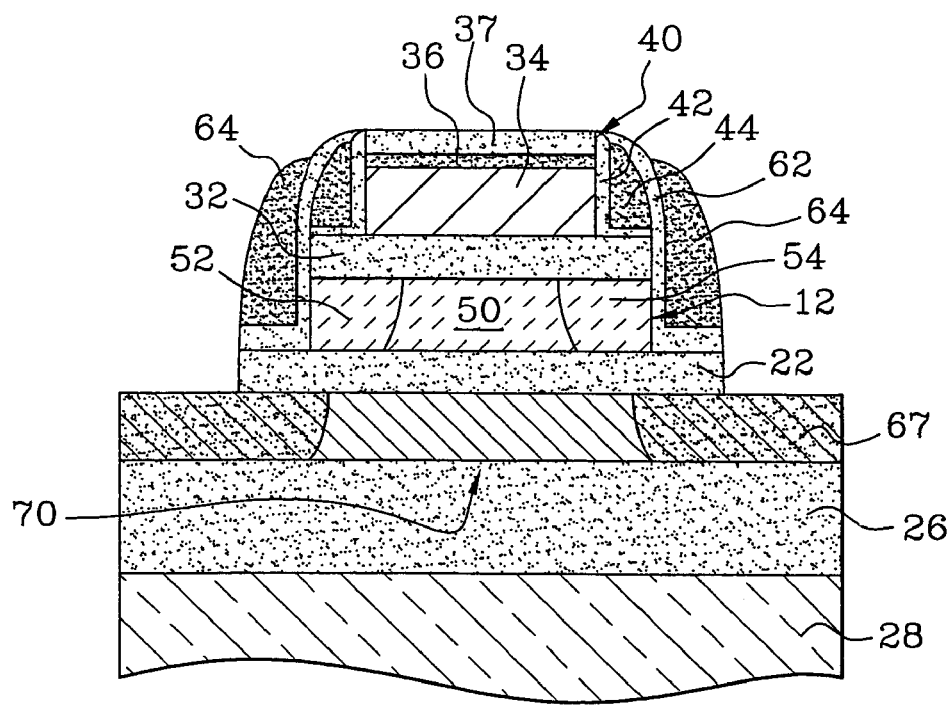

FIGS. 16 and 17, described hereinafter illustrate implementation of a variant of the process.

FIG. 16 shows a device identical to that of FIG. 3B. At this stage of the process the gate 40 with the first pedestal layer 42 and the first spacer 44 are formed. Source and drain regions 52, 54 are formed in the active layer 12, which is not yet etched. The second insulating gate layer 32, on the other hand, has already undergone self-aligned etching on the gate flanked by the pedestal layer 42 and the first spacer 44. It should be noted that, in contrast to FIG. 3B, the first gate layer 24 of the stack visible in FIG. 16 is a layer of metal. For example, this is a layer of W, TiN, Hf, Zr or an alloy of the latter.

In a way comparable to the process illustrated by FIG. 4, FIG. 17 shows the formation of the second pedestal layer 62, and of the second spacer 64. The second pedestal layer and the second spacer are formed after etching of the active layer. This etching is self-aligned on the gate flanked by the first spacer, in such a way the spacers cover the flanks of the source and drain regions equally. The first and second spacers, just as the pedestal layers, associated with the upper gate 40, constitute an etching mask for self-aligned etching of the first insulating gate layer 22. This etching exposes the unprotected parts of the first gate layer 24.

A following stage consists of oxidation of the first gate layer 24.

Oxidation is self-aligned on the gate 40 flanked by the first and second spacers. It reaches the unmasked parts of the first gate layer and advances slightly under the insulating gate layer 22. The oxidised parts of the gate layer, designated by reference numeral 67, are electrically insulating; they accordingly delimit a lower gate 70 in the first gate layer.

Oxidation of the first gate layer preferably takes place in an atmosphere of water vapour and at a relatively low temperature, of between 200 and 700° C. By respecting this range of temperatures, diffusion of the doping types of the regions source 52 and drain 54, towards the channel 50 can be neglected. The duration of the oxidation treatment allows the lateral extension of the oxidised regions 67 and thus the dimensions of the lower gate to be adjusted.

The manufacture of the transistor can be carried out in accordance with the process described in reference to FIGS. 12 to 15, for the formation of lateral extensions of source and drain, and for the conditioning of the transistor.

During these stages the oxidised regions 67 are preferably kept as insulation of the lower gate. They can also be selectively etched and replaced by another insulation.

Figure 18:
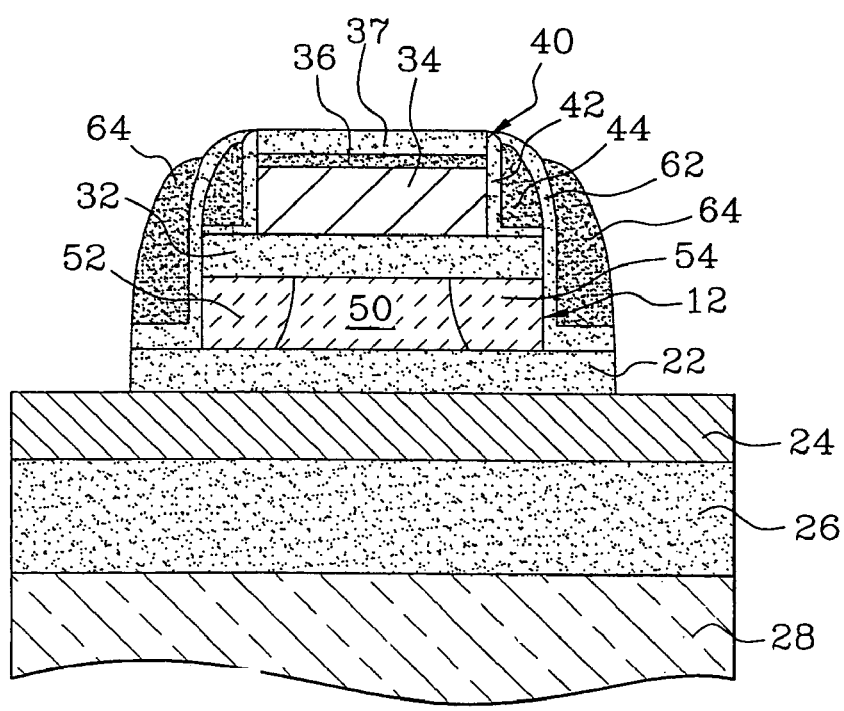
FIGS. 18 to 22 are diagrammatic sections of the device of FIG. 5 and illustrate stages of manufacture of a transistor according to another variant of the process previously described.

Another variant of the process is described in reference to FIG. 18 and following.

The stages described in reference to FIG. 18 and following follow on from those described in reference to FIG. 5. All the same, in contrast to FIG. 5, the material of the first gate layer is not selected above all for its properties for conducting electricity but for its ease of removal by selective etching. In effect, the first gate layer 24, visible in FIG. 18, is a sacrificial layer.

FIG. 18 shows the device obtained after the self-aligned etching of the second insulating gate layer 22 by using the gate 40, flanked by the first and second spacers 42, 62, as etching mask. Etching takes place with stop on the first gate layer 24. Outside the parts protected by this mask, the first gate layer is exposed.

Figure 19:
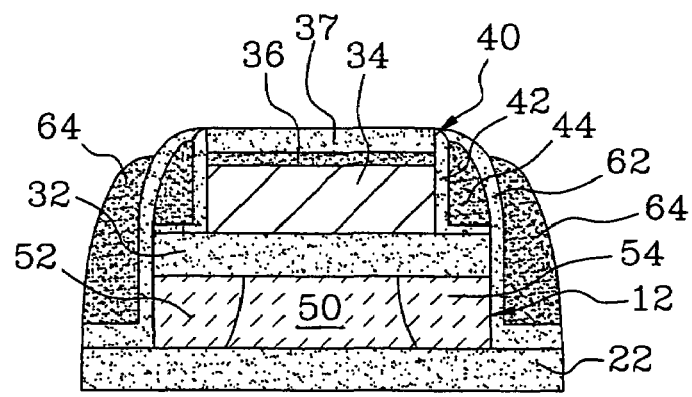
Figure 19:
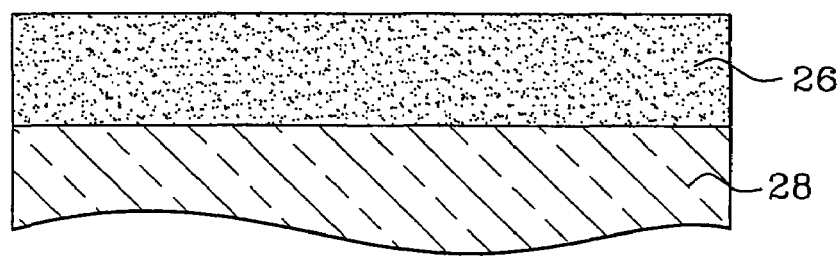

A following stage, illustrated by FIG. 19, comprises selective removal of the first gate layer 24. The removal of the gate layer may take place by humid isotropic etching.

Figure 20:
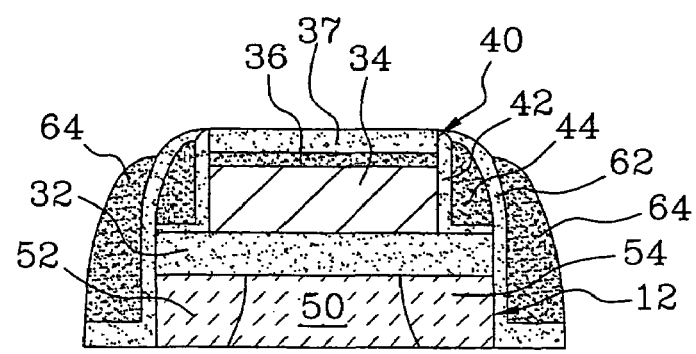
Figure 20:
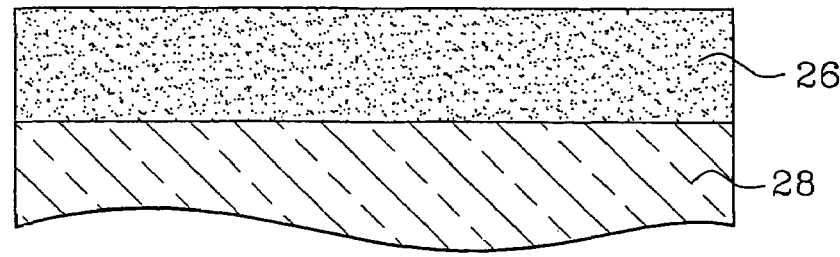

A supplementary facultative stage, illustrated by FIG. 20, also comprises selective removal of the first layer 22 of gate insulation exposed on its face turned towards the insulating base layer 26. The first insulating gate layer, in spite of the selective nature of the preceding etchings, risks having been cut slightly. Its removal, then ultimate replacement, guarantee improved uniformity of the gate insulation. It should be specified that, contrary to the impression given by FIGS. 19 and 20, the part of the transistor initially located above the first gate layer does not float but remains outside the active region, for example, by the layers of gate insulation. To this effect the first gate layer can be optionally formed during formation of the initial stack of the substrate, following the example of the active layer.

Figure 21:
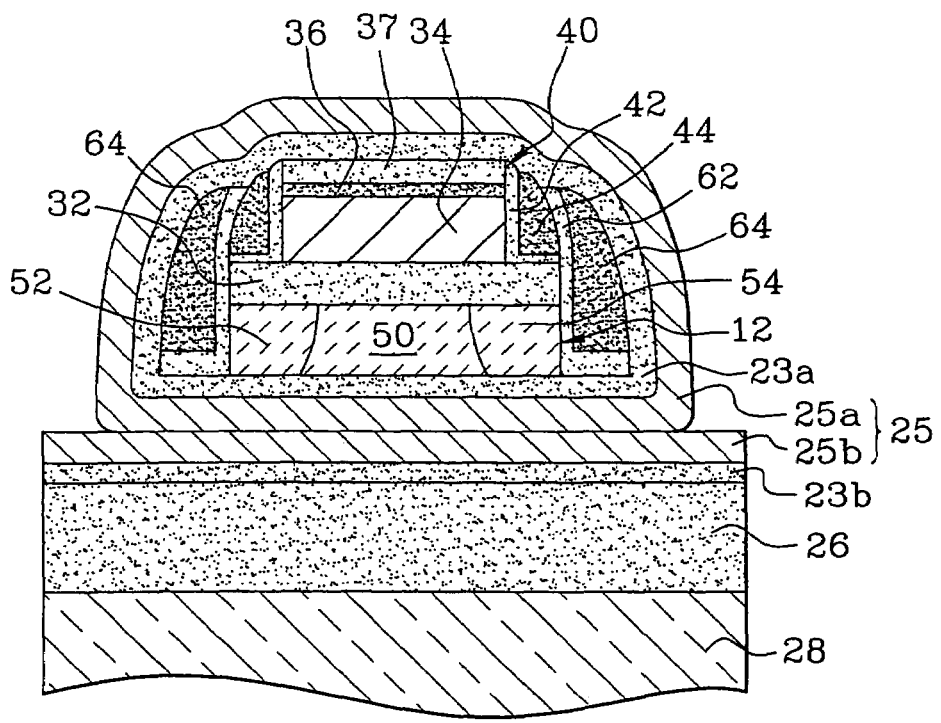

FIG. 21 shows the formation of a new insulating gate layer 23a by appropriate deposit of a layer of silicon oxide. The layer 23a is formed on the face of the active layer 12 turned towards the insulating base layer 26 or the block of solid silicon 28. An equivalent insulating layer 23b is formed simultaneously on the insulating base layer 26.

According to another possibility, a new insulating gate layer can also be formed by superficial oxidation of the exposed part of the active layer 12. In this case an additional oxide layer is not formed on the insulating base layer 26.

The formation of the new insulating gate layer 23a is followed by appropriate depositing of a new gate layer 25. This is formed likewise in two parts 25a and 25b in contact respectively with the news insulating layers 23a and 23b, the two parts combining to form the new gate layer. The new layer gate is for example made of a metal of the same type as those already mentioned for the manufacture of the first and second gate layers.

It can be observed in FIG. 21 that the new insulating gate layer 23a and a part 25a of the new gate layer carpet the walls of the gate structure, that is, of the gate flanked by the spacers.

Figure 22:
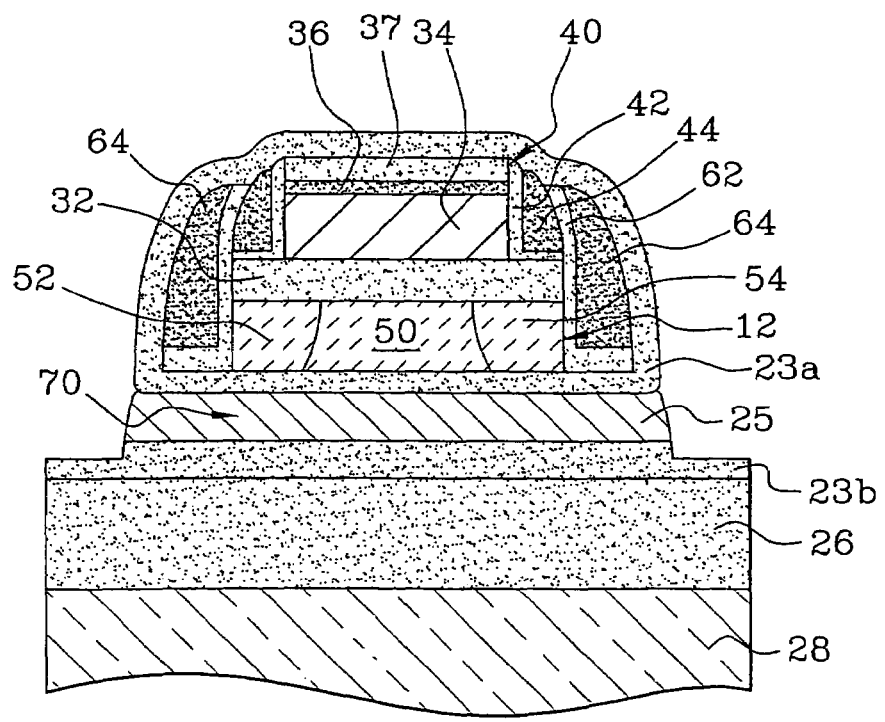

FIG. 22 shows the result of selective anisotropic etching aimed at removing the material from the new gate 25. Etching takes place with stop on the new insulating gate layer 23b, which carpets the insulating base layer 26. As shown in FIG. 22, the new insulating layer 23b can optionally be slightly attacked if selectivity is insufficient. Etching removes the entire part of the new gate layer, which is not protected by the gate structure comprising the gate 40, the spacers and pedestal layers, and similarly for the new insulating gate layer 23a. Again, this is self-aligned etching on the upper gate 40. Etching delimits a lower gate 70 centred on the upper gate and symmetrical relative to the latter, especially in the cutting plane of the figure.

Manufacturing of the transistor can be completed as described previously in reference to FIGS. 12 to 15.

Figure 23:
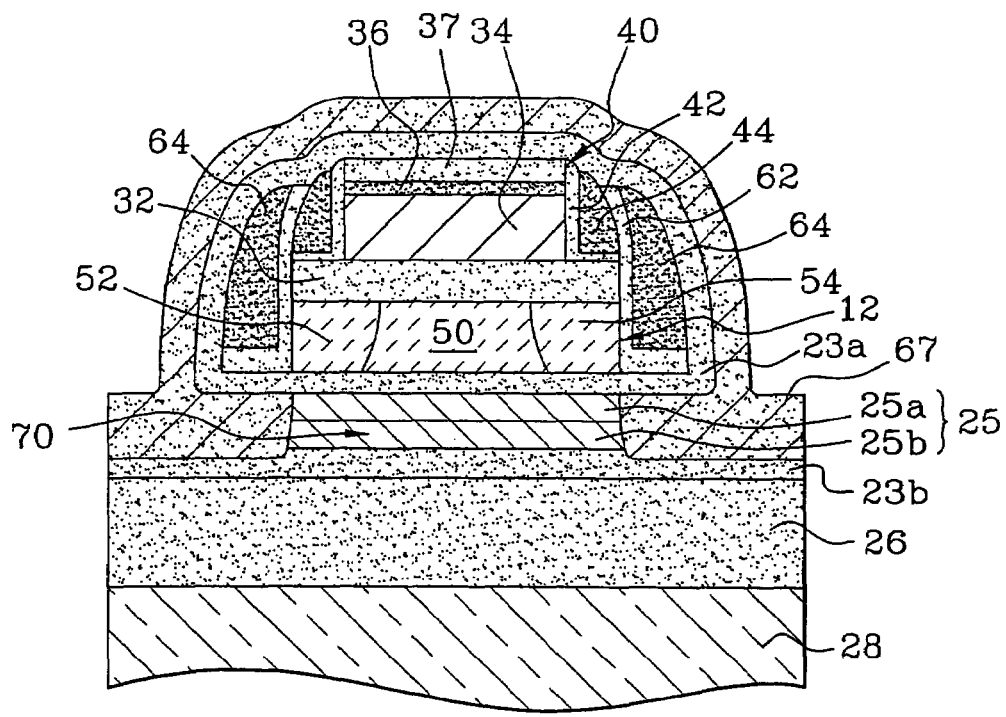
FIG. 23 is a diagrammatic section of the device of FIG. 21 and illustrates a stage of manufacture of a transistor according to yet another variant of the process previously described.

FIG. 23 illustrates yet another variant of the process which follows on from the stages described in reference to FIG. 21. According to this variant, the new lower gate is not delimited by etching but by selective oxidation. By subjecting the structure obtained in terms of the stages in FIG. 21 in an oxidising atmosphere, the ensemble of the unprotected parts of the new gate layer 25, and designated by reference numeral 67 are oxidised and thus made electrically insulating. Oxidation is stopped by the subjacent layers of oxide or silicon nitride. As shown in FIG. 23, oxidation of the new gate layer continues slightly under the ensemble formed by the gate 40, the spacers and by the new insulating gate layer 23a. This ensemble forms an oxidation mask and allows definition of the lower gate 70 self-aligned on the upper gate. In subjecting the structure for more or less a long time in an oxidising atmosphere, it is possible to more or less advance the oxide layer 67 and laterally adjust the lateral extension of the lower gate 70.

Figure 24:
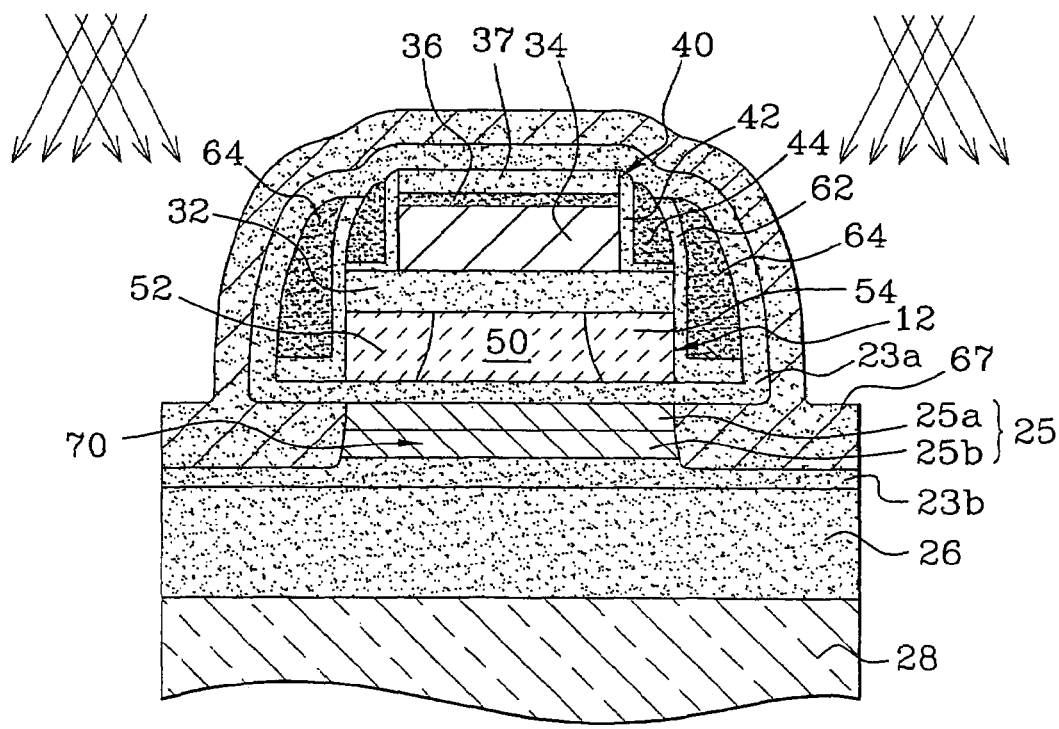
FIGS. 24 and 25 are diagrammatic sections of the device of FIG. 22 and illustrate stages of manufacture of a transistor according to a fourth variant of the process previously described.

FIG. 24 illustrates yet another variant of the process which likewise follows the stages described in reference to FIG. 21.

The structure obtained from these stages is subjected to doping implantation. Doping, symbolised by arrows, utilises the upper gate flanked by the spacers 44, 64, and by the new insulating gate layer 23a, as implantation mask to form in the new gate layer 25 of the doped self-aligned 66 regions.

The latter likewise delimit the lower gate 70 which is likewise located self-aligned on the upper gate.

Figure 25:
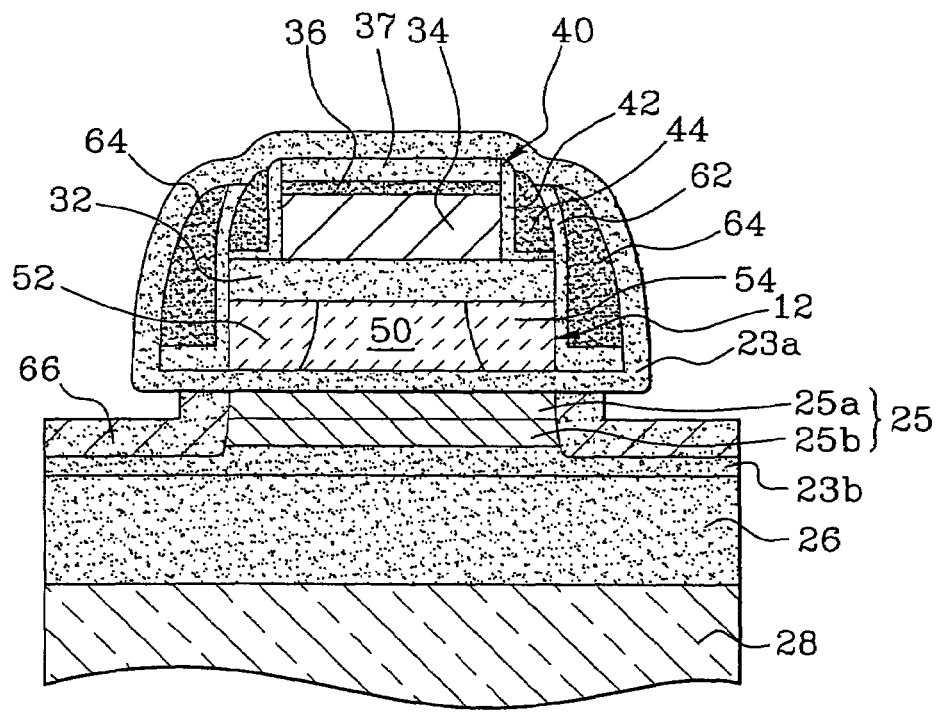

FIG. 25 shows a subsequent stage consisting of selectively etching the doped regions.

Etching, self-aligned on the gate, the spacers and the new insulating gate layer, can be partial or total. It can be followed by stages of insulation, formation of contacts and conditioning of the transistor. The description of these stages, already given previously, is not repeated here.

Different possibilities for establishing contacts on the gates and for interconnection of the upper and lower gates will now be discussed.

Figure 26:
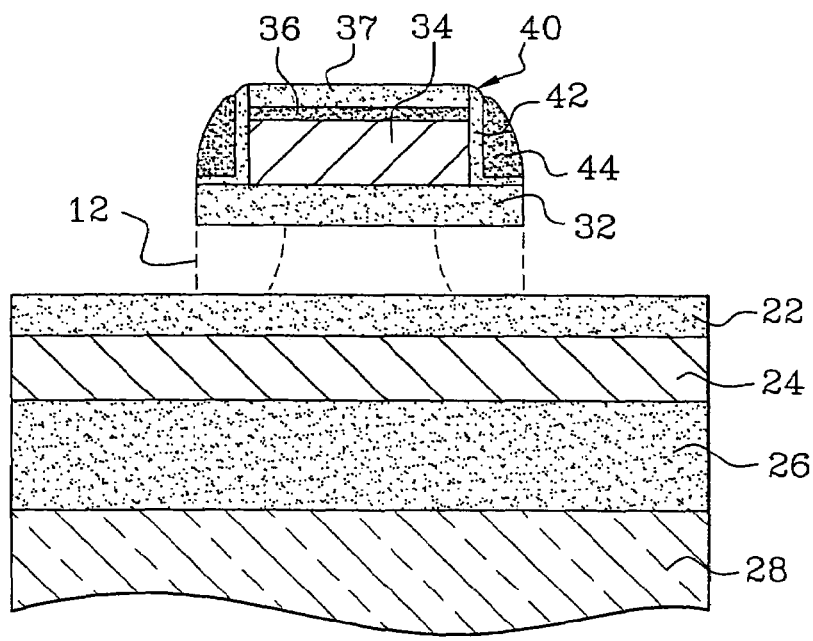
FIGS. 26 to 29 are diagrammatic sections of the device of FIG. 4 and illustrate different stages of the manufacture of the transistor in a gate end region.

FIG. 26 is a section of the device of FIG. 3B according to a cutting plane parallel to that of FIG. 3B, but in an end region of the gate 40. In this region, the active layer 12 is removed, shown in dashed lines, by subjecting it to selective etching. During this etching, a part of the transistor corresponding to a central region of the gate is protected by an etching mask. The function of this mask is to avoid any alteration to the active layer in the central region which corresponds to the cutting plane of FIG. 3B. The layers, which top the active layer in the end region of the gate, are maintained especially by the active layer in the region or the latter is not removed.

Figure 27:
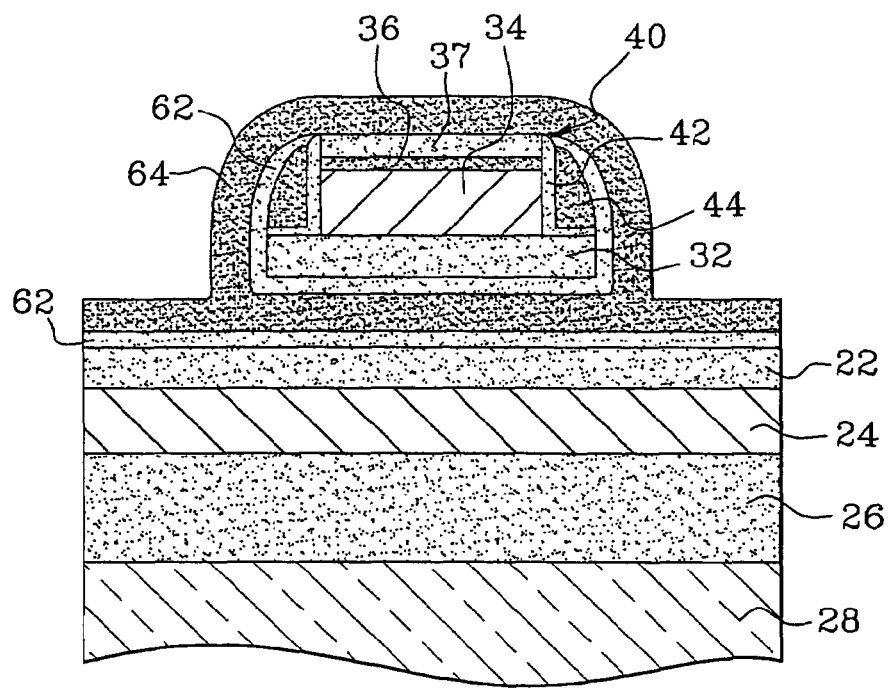

FIG. 27 shows the end region of the gate during deposit of the second pedestal layer 62, then of the layer of silicon nitride 64 to form the second spacer. The appropriate deposit of these layers takes place not only on the flanks of the first spacers 44, but also on the parts flush with the first and second layers of gate insulation 22, 32.

Figure 28:
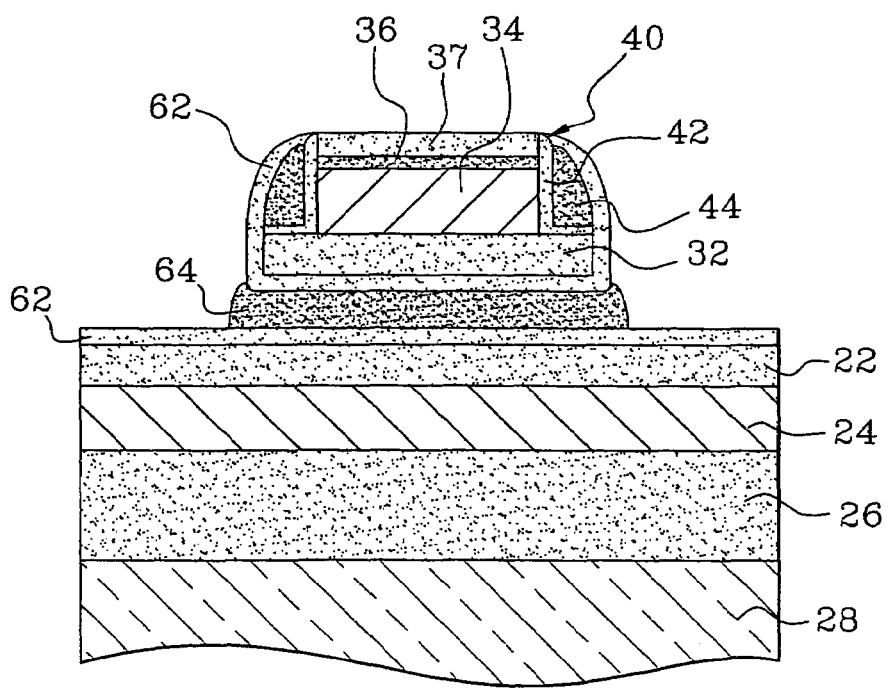

FIG. 28 shows the result of selective anisotropic etching of the layer of silicon nitride, for removing all the parts not protected by the gate 40, the first spacers and the second pedestal layer 62. It should be noted that the same etching is put to advantage to form the second lateral spacers in the central region of the gate. Reference is made here to FIG. 4, previously described.

Figure 29:
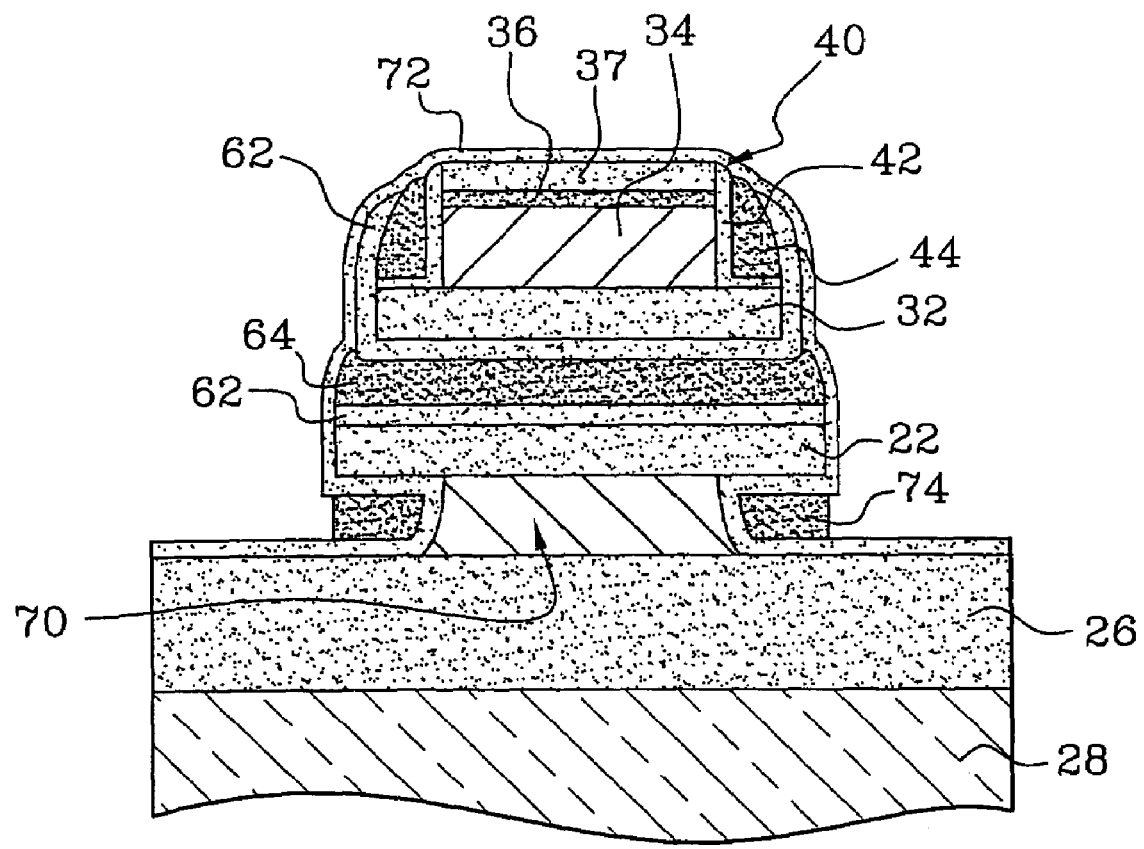

FIG. 29 shows by way of indication the state of the end region of the gate, after delimiting of the lower gate 70, formation of the third pedestal layer 72 and formation of the third buried spacer 74. The operational stages, which lead to obtaining the structure illustrated by FIG. 29, are the same as those described in reference to FIGS. 10 and 11. It is shown in FIG. 29 that, between the upper gate 40 and the lower gate 70, there is no conducting layer, but only electrically insulating layers. There are especially the layers of gate insulation 22, 32, for example made of silicon oxide, the second pedestal layer 62, likewise made of silicon oxide, and the second spacer layer 64 made of silicon nitride.

Figure 30:
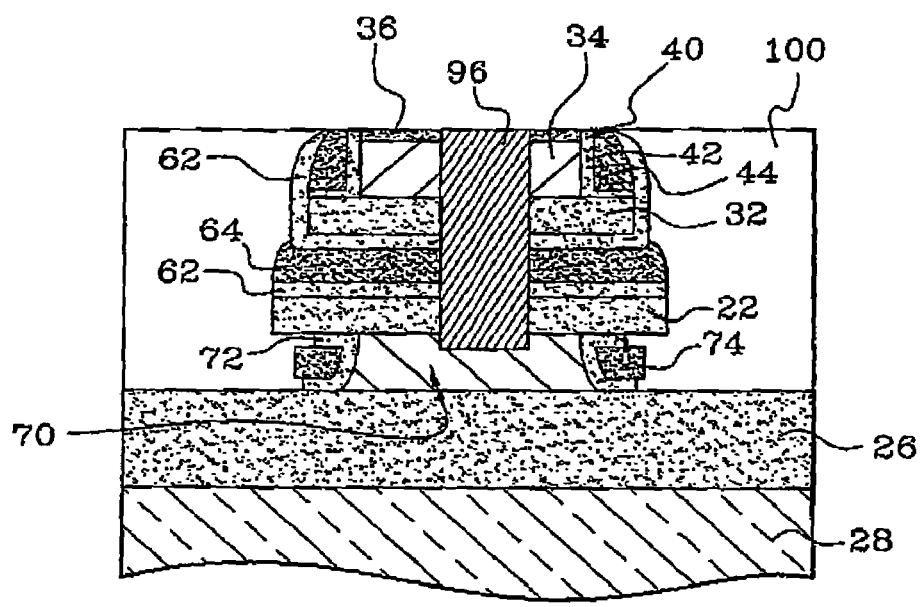
FIGS. 30 and 31 are diagrammatic sections of the device of FIG. 29 and illustrate the manufacture of a gate contact.

FIG. 30 shows the end region of the gate after deposit of the thick layer of insulating material 100, and after this layer has been planed. A well is etched vertically to the upper gate through the ensemble of the layers until it reaches the lower gate. Because of different materials encountered during etching of the wells, the latter can make use of different etching agents. The well is metallised, for example by cutting it from a metal such as Ti, Cu or W, for example. After it is formed on the free face of the device the metal constitutes a gate contact 96. The metal likewise ensures interconnection of the upper and lower gates. As the active region is removed in this part of the transistor any risk of short-circuit between the gates and the channel or the source and drain regions is prevented.

Figure 31:
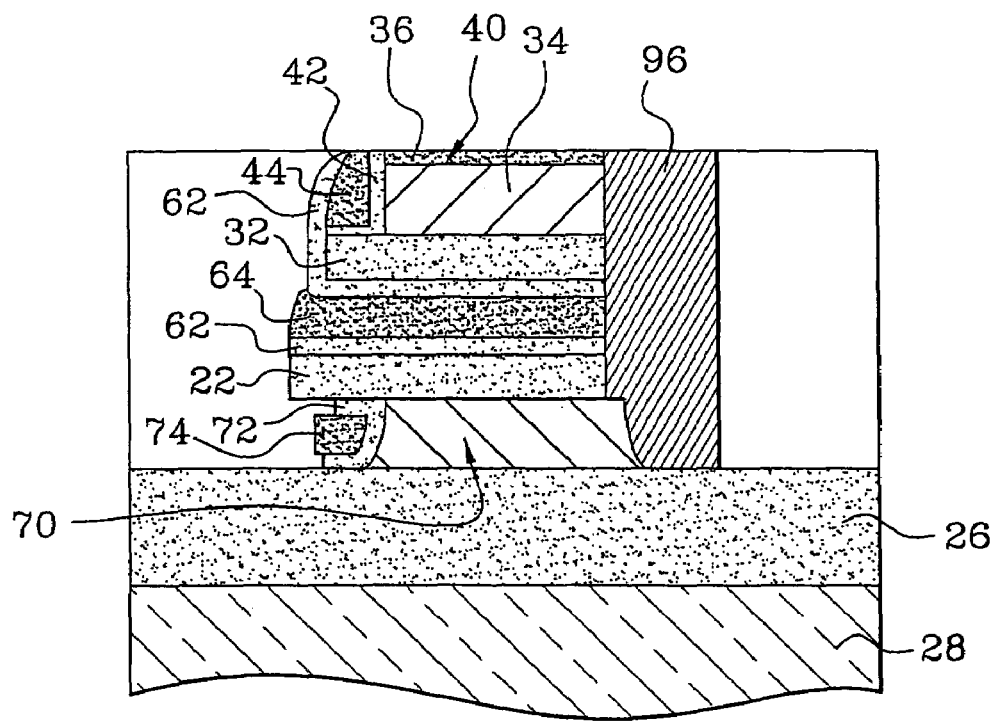

FIG. 31 shows the making of the wells and of the contacts of gate 96, on the edge of the gate. It can be seen that the contact of gate 96 is prolonged as far as on the insulating base layer 26.

Figure 32A:
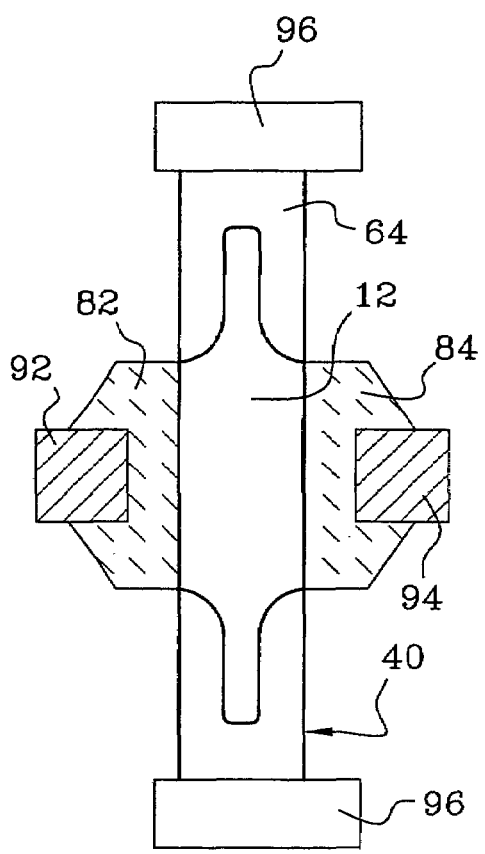
FIGS. 32A and 32B are diagrammatic sections of the device of FIG. 30 according to a cutting plane parallel to the plane of the different layers of the transistor, and passing through the active layer.
Figure 32B:
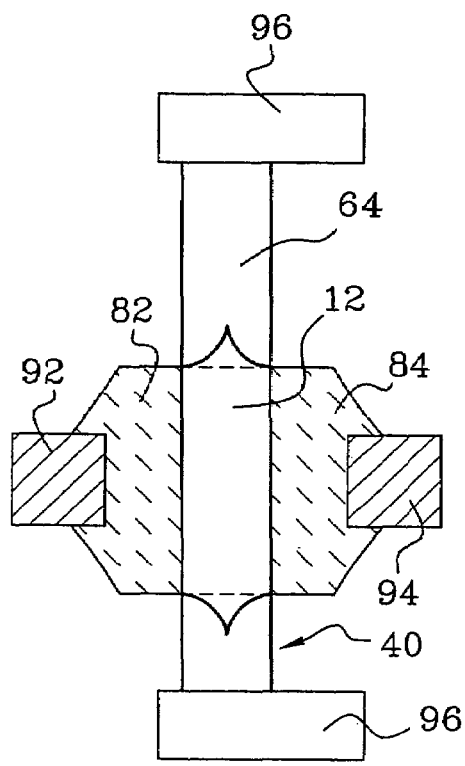

FIGS. 32A and 32B are diagrammatic sections of the transistor according to a cutting plane A—A in FIG. 15. This plane is parallel to the principal plane of the layers and merges into the active layer 12. In FIGS. 32A and 32B the thick insulating layer 100 is considered transparent for the sake of clarity. The contacts of source and drain 92, 94, respectively in contact with the regions of lateral extension of source and drain 82, 84 can be seen. Likewise, a gate contact 96 is noted at each end of the gate 40. The two FIGS. 32A and 32B correspond respectively to situations where the gate extends less far than an etching mask to define the limit of the active region. This is the case when isotropic etching is utilised to define the gate. Over-etching takes place under the mask (not shown here).

In FIG. 32B, dashed lines mark the limit of a mask and a gate defined by anisotropic etching according to this mask. The phenomenon of over-etching does not appear in this case.

Figure 33:
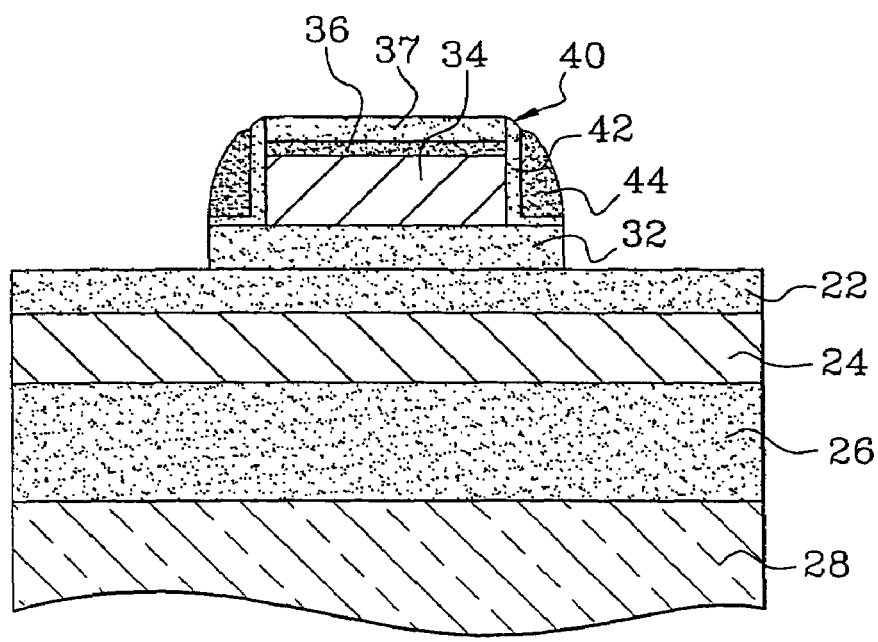
FIG. 33 is a diagrammatic section of the device of FIG. 4, formed on a substrate as per FIG. 2A, according to a cutting plane passing out of an active region.

According to a variant of the process, in which the active region has been limited as per FIG. 2A, a structure according to that in FIG. 33 is obtained directly, beyond the active region. This structure is represented at a stage of the process corresponding to FIG. 4 previously described. As the active layer is removed outside the active region, the insulating layers of gate 32 and 22 rest directly on one another. In this case likewise, no conductor or semi-conductor layer separates the layers 24, 34 in which the upper and lower gates are defined. The manufacture of a gate contact by etching a well, then by metallisation of the latter can take place in the manner previously described.

Literature
1) FR-A-2 757 312
2) FR-A-2 806 832
3) Scaling Theory for $V_{th}$ Controlled n$^+$-p$^+$Double-Gate SOI
   MOSFETS, Kunihiro Suzuki et al.
4) High-Speed and Low-Power n$^+$-p$^+$Double-Gate SOI CMOS, IEICE Trans Electron, vol. E-78 C, no. 4 April 1995.

The invention claimed is:

1. A field-effect transistor comprising:
   a support substrate,
   an active region comprising a channel,
   a first insulated gate associated with a first face of the active region,
   source and drain regions formed in the active region and self-aligned on the first insulated gate,
   a second insulated gate associated with a second face of the active region, opposite the first face of the active region, wherein
   the second insulated gate, which is the closest to the support substrate, is self-aligned on the first insulated gate and the first and second insulated gates form a mesa structure on the support substrate, and wherein
   first spacers are arranged on a side of the first insulated gate and on top of the source and drain regions, and an outer edge of the first spacers are flush with an outer edge of the source and drain regions.

2. A process for manufacturing a transistor with self-aligned double gates comprising the steps of:
   forming of a stack of layers onto a support substrate, the stack of layers including:
      a first gate layer,
      a first insulating gate layer,
      an active layer,
      a second insulating gate layer, and
      a second gate layer,
   defining an upper gate in the second gate layer,
   forming source and drain regions, self-aligned on the upper gate in the active layer,
   defining a lower gate, arranged between the support substrate and the active layer, and self-aligned on the upper gate, the defining of the upper gate being realized without previously roughing out the lower gate.

3. The process as claimed in claim 2, including forming the lower gate in the first gate layer.

4. The process as claimed in claim 3, including delimiting the lower gate by selective etching self-aligned on the upper gate.

5. The process as claimed in claim 4, wherein ionic doping of the first gate layer, self-aligned on the upper gate, is carried out by using the upper gate as a doping mask, to locally dope the first gate layer, and a doped part of the first gate layer is selectively engraved.

6. The process as claimed in claim 3, including delimiting the lower gate by oxidation self-aligned of the first gate layer.

7. The process as claimed in claim 2, wherein forming the lower gate comprises replacing the first gate layer by at least a new gate layer, then performing self-aligned delimitation of the new gate layer.

8. The process as claimed in claim 7, wherein the delimiting of the new gate layer is by selective etching self-aligned on the upper gate.

9. The process as claimed in claim 8, wherein ionic doping of the new gate layer, self-aligned on the upper gate, is carried out by using the upper gate as a doping mask, to locally dope the new gate layer, and a doped part of the new gate layer is selectively engraved.

10. The process as claimed in claim 7, wherein the delimiting of the new gate layer is by self-aligned oxidation on the first gate layer.

11. The process as claimed in claim 2, including forming first and second gates extending in a region beyond the active region, and a metallized well traversing the stack of layers to electrically link the upper gate with the lower gate in the region beyond the active region.

12. The process as claimed in claim 2, further comprising self-aligned etching of the active layer, by using the upper gate as an etching mask.

13. The process as claimed in claim 12, wherein first spacers are formed on the upper gate before self-aligned etching of the active layer.

14. The process as claimed in claim 12, including delimiting the lower gate prior to etching of the active layer using the active layer and the upper gate as etching masks.

15. The process as claimed in claim 14, including forming second spacers on the upper gate and on the active layer, before delimiting the lower gate.

16. The process as claimed in claim 2, including forming lateral extensions of source and drain on the source and drain regions using epitaxy.

17. The process as claimed in claim 16, including insulating the transistor, then forming contacts on the lateral extensions of source and drain, after formation of the lateral extensions.

18. The process as claimed in claim 2, including forming a pedestal layer to cover the first and second insulating gate layer, the active layer, and the first spacers.

19. The process as claimed in claim 2, including forming third spacers between the first insulating gate layer and the substrate, on a side of the lower gate.

20. The process as claimed in claim 2, including forming lateral extension of the source and drain regions in contact with the second insulating gate layer.

21. The field-effect transistor as claimed in claim 1, further comprising:

third spacers arranged between a first insulating gate layer and the support substrate, on a side of the second insulated gate, wherein the first insulating gate layer is located between the second insulated gate and the active region.

* * * * *